US009714994B2

(12) United States Patent
Takizawa et al.

(10) Patent No.: US 9,714,994 B2
(45) Date of Patent: Jul. 25, 2017

(54) MAGNETIC RESONANCE IMAGING APPARATUS, AND METHOD FOR CORRECTING MEASUREMENT-SPACE COORDINATES

(75) Inventors: Masahiro Takizawa, Tokyo (JP); Tetsuhiko Takahashi, Tokyo (JP); Miyuki Kawamura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 1128 days.

(21) Appl. No.: 13/881,207

(22) PCT Filed: Oct. 28, 2011

(86) PCT No.: PCT/JP2011/074892
§ 371 (c)(1),
(2), (4) Date: Apr. 24, 2013

(87) PCT Pub. No.: WO2012/063654
PCT Pub. Date: May 18, 2012

(65) Prior Publication Data
US 2013/0207654 A1    Aug. 15, 2013

(30) Foreign Application Priority Data
Nov. 9, 2010    (JP) ................................. 2010-251143

(51) Int. Cl.
*G01V 3/00*    (2006.01)
*G01R 33/48*    (2006.01)
(Continued)

(52) U.S. Cl.
CPC ............. *G01R 33/48* (2013.01); *G01R 33/28* (2013.01); *G01R 33/56572* (2013.01); *G01R 33/4824* (2013.01)

(58) Field of Classification Search
CPC ............................................... G01R 33/56572
(Continued)

(56) References Cited

U.S. PATENT DOCUMENTS 6,969,991 B2 * 11/2005 Bammer .......... G01R 33/56518
324/307
8,755,582 B2 *  6/2014 Kimmlingen ........ G01R 33/243
382/131
(Continued)

FOREIGN PATENT DOCUMENTS

WO    WO2010/074059    7/2010

OTHER PUBLICATIONS

International Search Report in PCT/JP2011/074892.
(Continued)

*Primary Examiner* — Louis Arana
(74) *Attorney, Agent, or Firm* — Cooper & Dunham LLP

(57) ABSTRACT

In order to approximate the gradient magnetic field pulse waveform shape with high accuracy and improve the image quality at the time of imaging cross-section change or oblique imaging, an MRI apparatus of the present invention divides the waveform shape of the gradient magnetic field pulse into a plurality of sections, defines an approximation function for each section, and corrects the k-space coordinates at which the echo signal is arranged using the parameter of the approximation function. In addition, an optimal parameter of the approximation function of the waveform shape of the gradient magnetic field pulse is searched for using the measured signal.

14 Claims, 18 Drawing Sheets

(51) Int. Cl.
*G01R 33/565* (2006.01)
*G01R 33/28* (2006.01)

(58) Field of Classification Search
USPC .................................... 324/309, 307, 314
See application file for complete search history.

(56) References Cited

U.S. PATENT DOCUMENTS

| | | | | |
|---|---|---|---|---|
| 8,890,530 B2* | 11/2014 | Umeda | ............ | G01R 33/56518 324/318 |
| 2014/0125333 A1* | 5/2014 | Hanada | ............ | G01R 33/56518 324/307 |
| 2017/0038452 A1* | 2/2017 | Trzasko | ............ | G01R 33/56572 |

OTHER PUBLICATIONS

A. Takahashi et al., "Compensation of multi-dimensional selective excitation pulses using measured k-space trajectories", Magnetic Resonance in Medicine, Sep. 1999, 446.
D. M. Spielman et al., "Spiral imaging on a small-bore system at 4.7T", Magnetic Resonance in Medicine, Oct. 1999, 580.
H. Tan et al., "K-space trajectory estimation in spiral imaging", Proc. Intl. Soc. Mag. Reson. Med., May 2007, 981.
J. Y. Cheng et al., "Gradient linear system modeling using gradient characterization", Proc. Intl. Soc. Mag. Reson. Med., May 2008, 1155.
H. Tan et al., "Estimation of k-space trajectories in spiral mri", Magnetic Resonance in Medicine, Jun. 2009, 1396.

* cited by examiner

FIG.4
(a)
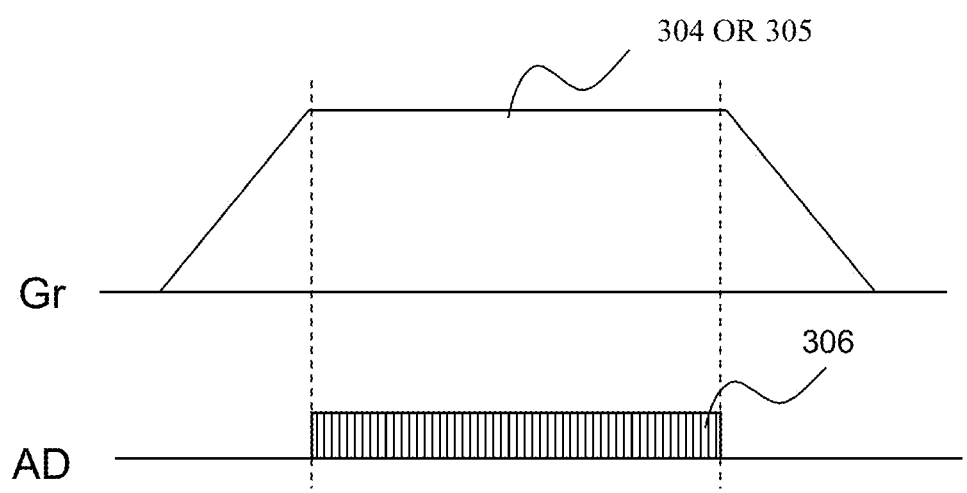
(b)
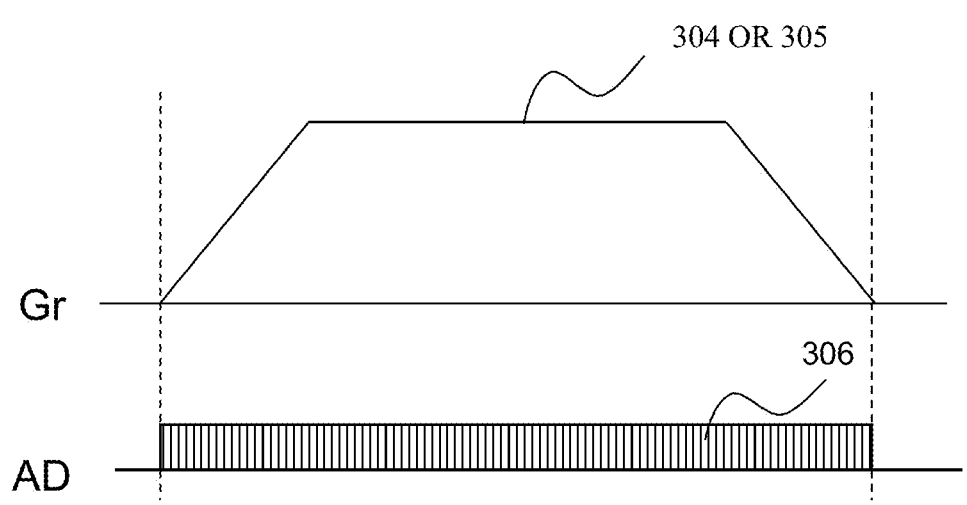

FIG.5
(a)
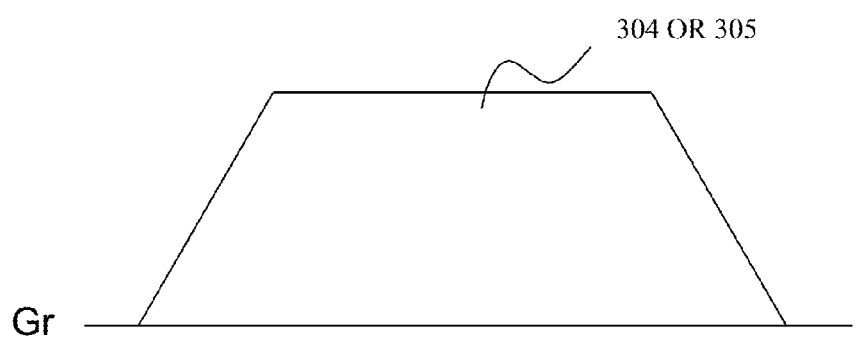
(b)
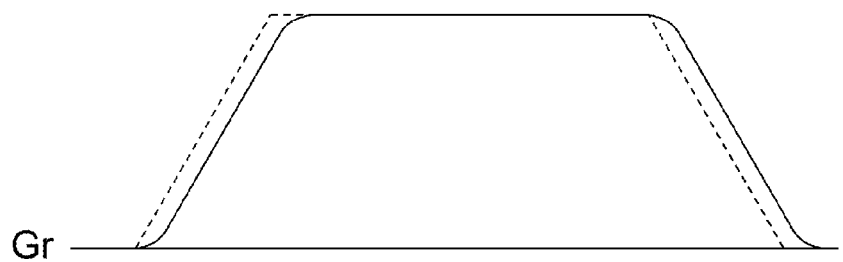
(c)
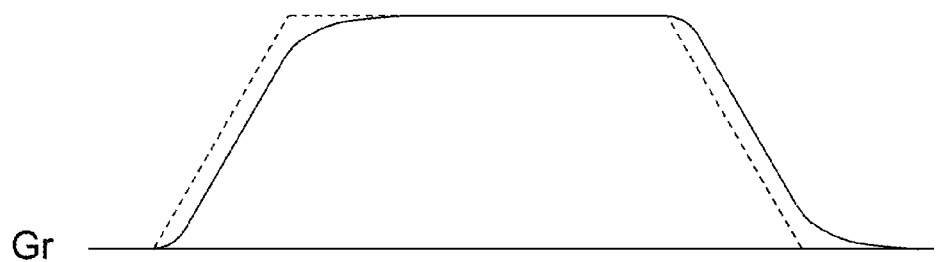

FIG.6
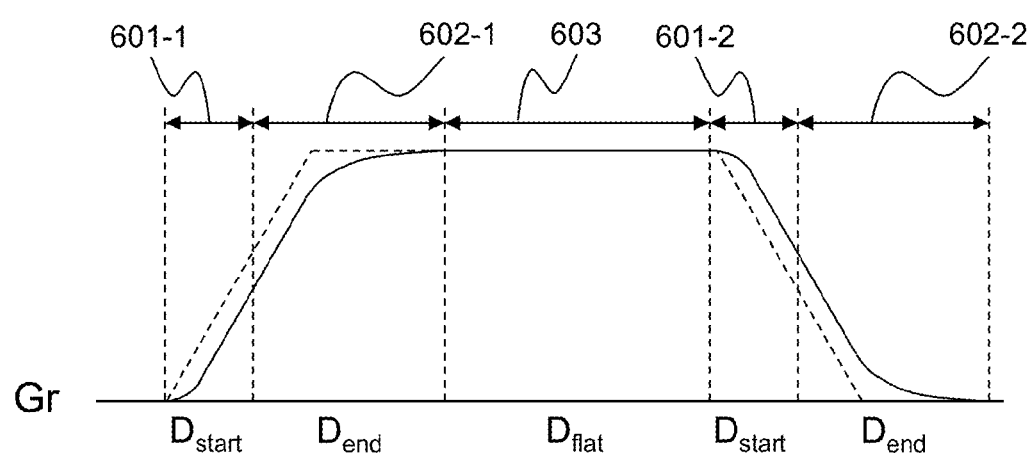
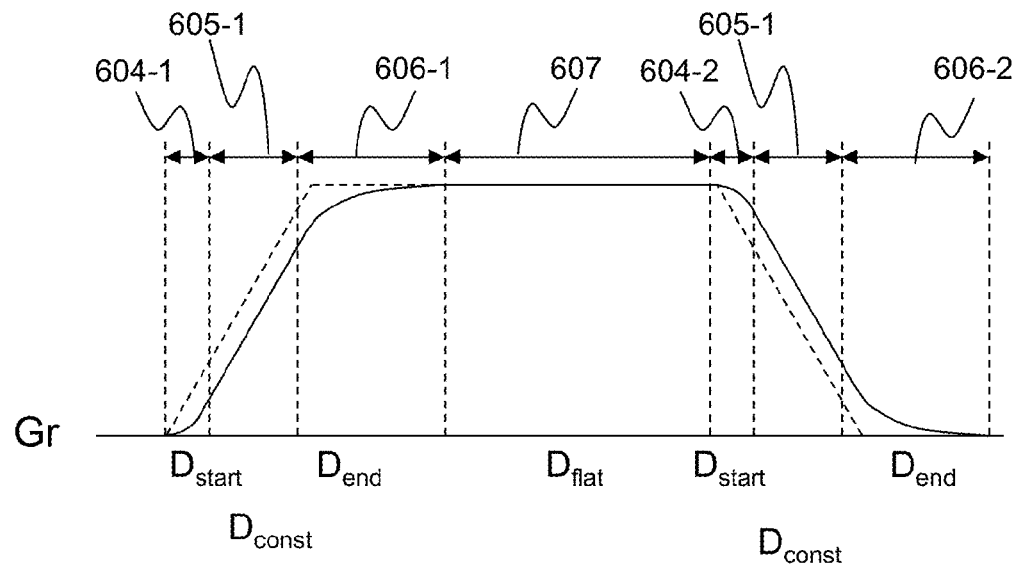

FIG.7
(a)
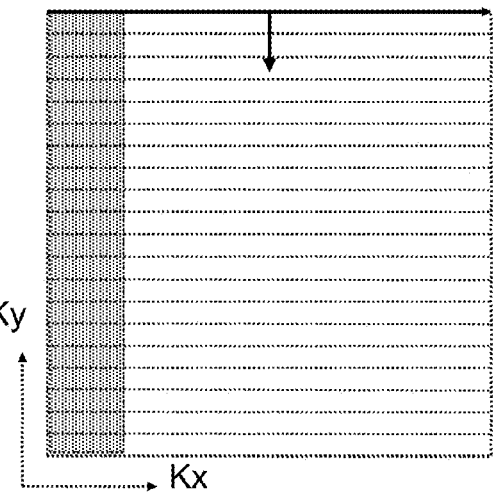
(b)
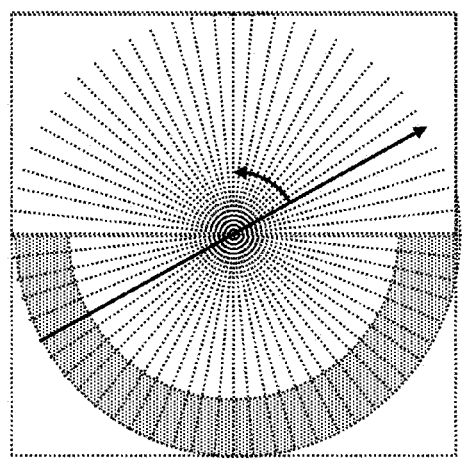
(c)
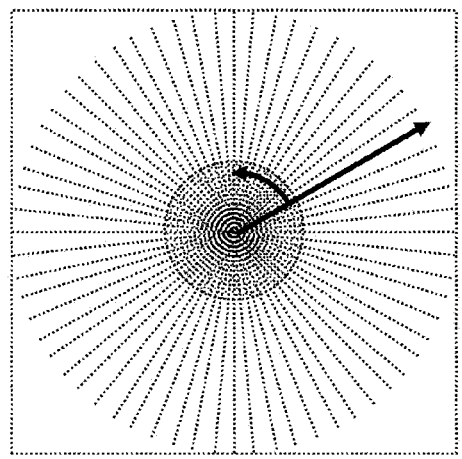

FIG.8
(a)
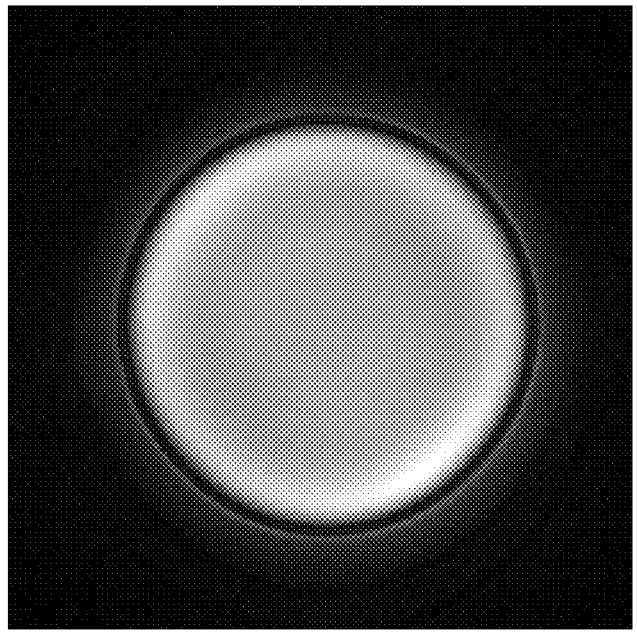
NO MEASUREMENT-SPACE CORRECTION
(b)
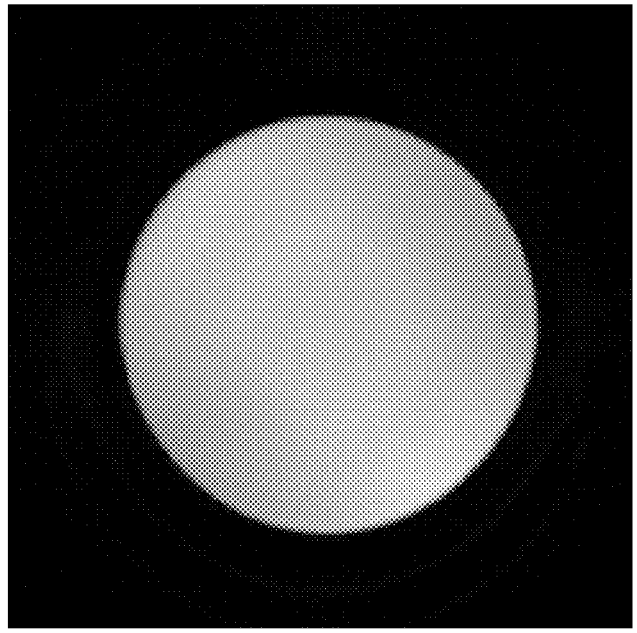
MEASUREMENT-SPACE CORRECTION FIG.13
(a)
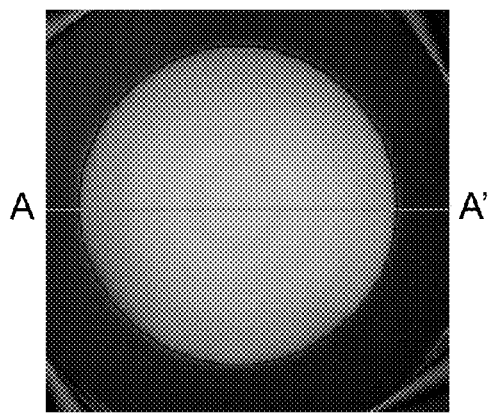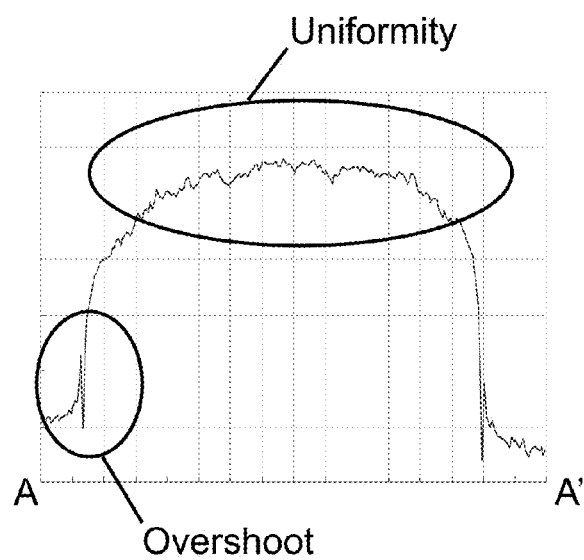
(b)
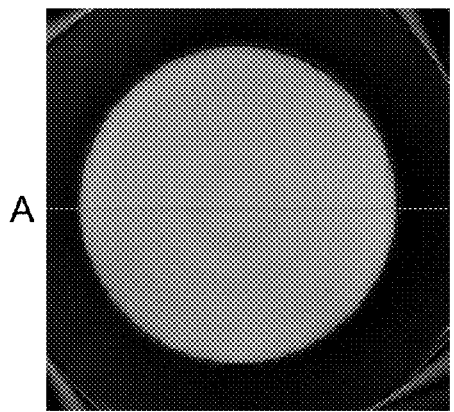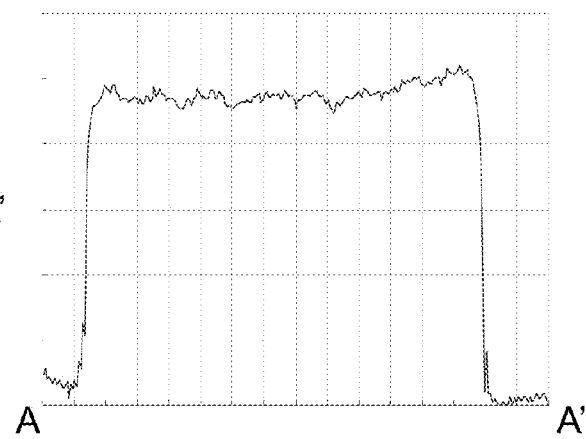

FIG.18
(a)
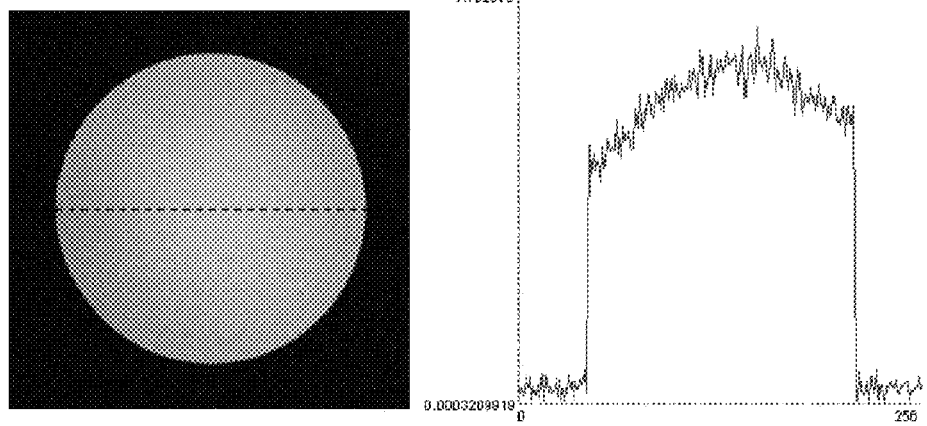
(b)
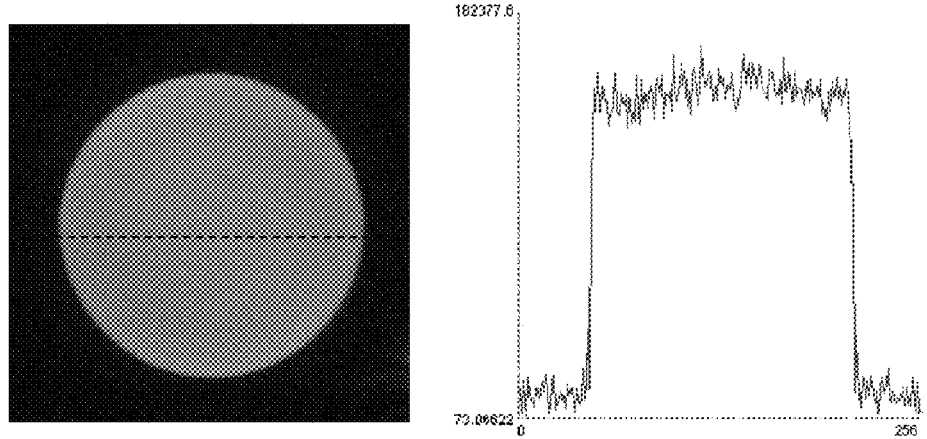
(c)
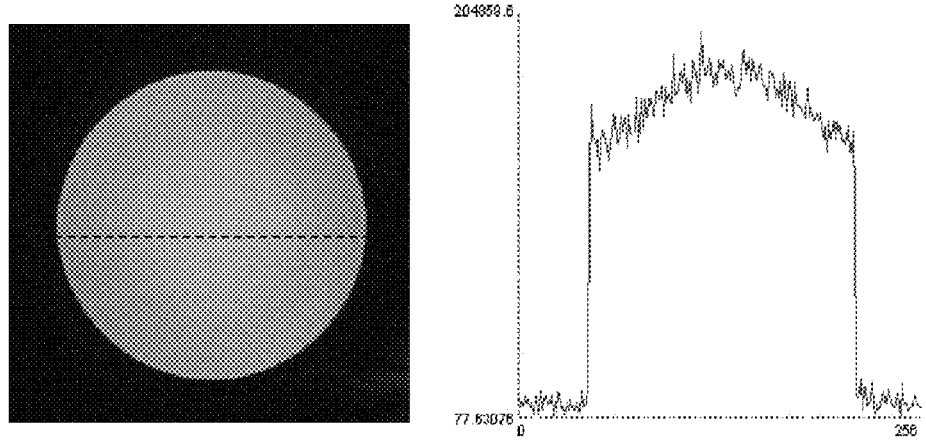

MAGNETIC RESONANCE IMAGING APPARATUS, AND METHOD FOR CORRECTING MEASUREMENT-SPACE COORDINATES

TECHNICAL FIELD

The present invention relates to a magnetic resonance imaging (hereinafter, abbreviated as "MRI") apparatus that acquires a tomographic image of an examination part of an object using a nuclear magnetic resonance (hereinafter, abbreviated as "NMR") phenomenon and in particular, to a technique for reducing artifacts caused by deviation of the gradient magnetic field pulse waveform from the ideal waveform due to the response of the system.

BACKGROUND ART

In the MRI apparatus, a gradient magnetic field is used to give position information to an echo signal from an object placed in the static magnetic field. Specifically, the coordinates of an echo signal arranged in measurement-space (k-space) are determined by the hysteresis of the gradient magnetic field in each direction that is applied when generating the echo signal. An image of the object is reconstructed by performing an inverse Fourier transform of the echo signal data that fills this k-space. The k-space coordinates are determined on the assumption that the gradient magnetic field pulse has a designed waveform, and the magnitude of the gradient magnetic field pulse is determined when calculating the pulse sequence that controls imaging.

However, there is error in the actual gradient magnetic field output. For this reason, since the echo signal is arranged at the coordinates shifted from the coordinates at which the echo signal is to be originally arranged in k-space, there is a problem in that the image quality is degraded. This problem is serious in the image according to the imaging sequence of the non-orthogonal system sampling method for sampling k-space radially or spirally, compared with the imaging sequence of the orthogonal system sampling method for sampling k-space in parallel to the axial direction.

Here, the error of the gradient magnetic field output means a difference between the amount of the gradient magnetic field pulse set at the time of sequence calculation and the amount of the actually output gradient magnetic field pulse (the amount of the gradient magnetic field given to the spins of nuclei within the tissue that form the object). As the cause of this error, various causes, such as static magnetic field non-uniformity or gradient magnetic field offset, eddy current, temporal shift of the gradient magnetic field output, and rising (or falling) time shift, are included.

Among these causes, the static magnetic field non-uniformity or the gradient magnetic field offset rarely changes depending on the sequence or the imaging parameter. Therefore, it can be calculated and corrected in advance, and shimming, offset adjustment, and the like are included as a pre-scan in many cases. However, since the eddy current, the temporal shift of the gradient magnetic field output, and the rising time shift change depending on the sequence or the imaging parameter in many cases, it is difficult to calculate and correct them in advance. In the present invention, these components that are difficult to calculate and correct in advance are collectively called a system response of the gradient magnetic field output.

As a technique for solving the error of the gradient magnetic field output due to the system response, there is a method of measuring a gradient magnetic field pulse used in imaging, calculating the waveform, and performing correction at the time of image reconstruction or a method of measuring the system response of the gradient magnetic field output in advance and correcting the signal using the value at the time of image reconstruction. Applying the latter method to the non-orthogonal system sampling method has been proposed in NPL 1. Specifically, the gradient magnetic field output (gradient magnetic field waveform) considering the system response of the gradient magnetic field output is calculated by calculating an equivalent circuit to approximate the system response circuit of the gradient magnetic field output and performing a convolution operation of a transfer function (more precisely, a function obtained by the inverse Laplace transform thereof), which is expressed by this equivalent circuit, to the gradient magnetic field output.

CITATION LIST

Non Patent Literature

[NPL 1] S. H. Cho et al, Compensation of eddy current by an R-L-C circuit model of the gradient system, Proc. Intl. Soc. Mag. Reson. Med. 16: 1156 (2008)

SUMMARY OF INVENTION

Technical Problem

However, the actual output of the gradient magnetic field pulse is often corrected by the feedback circuit and the like in order to approximate the gradient magnetic field pulse waveform to the ideal shape. In this case, the gradient magnetic field pulse waveform shape that is output cannot be approximated by the system response circuit.

In addition, since the output characteristics of the gradient magnetic field pulse are different for each axis, the influence is more complicated at the time of imaging cross-section change or oblique. Therefore, it is an object of the present invention to improve the image quality by approximating the gradient magnetic field pulse waveform shape with high accuracy.

Solution to Problem

In order to solve the above-described problem, an MRI apparatus of the present invention is an MRI apparatus including: gradient magnetic field generation means forgiving a magnetic field gradient to a static magnetic field generated by static magnetic field generation means; signal transmission means for irradiating an examination target placed in the static magnetic field with a high-frequency magnetic field; signal receiving means for receiving an echo signal emitted from the examination target due to nuclear magnetic resonance; and signal processing means for processing the echo signal to reconstruct an image of the examination target, wherein the signal processing means includes approximation function generation means for generating an approximation function that, for each of at least two temporally divided sections of a gradient magnetic field pulse waveform to which the magnetic field gradient is given by the gradient magnetic field generation means, approximates the gradient magnetic field pulse waveform and correction means for correcting measurement-space coordinates, at which the echo signal is arranged, using the approximation function.

Advantageous Effects of Invention

According to the present invention, it is possible to reduce artifacts, such as signal loss or distortion, in reconstructed images based on various pulse sequences.

BRIEF DESCRIPTION OF DRAWINGS

FIG. 4 shows diagrams illustrating the relationship between the readout gradient magnetic field and the sampling, where FIG. 4(a) shows a typical sampling method and FIG. 4(b) shows a nonlinear sampling method.

FIG. 5 shows diagrams illustrating the system response appearing in the readout gradient magnetic field pulse waveform, where FIG. 5(a) shows an ideal waveform shape and FIGS. 5(b) and 5(c) show waveform shapes deformed due to the system response.

FIG. 6 shows diagrams illustrating the approximation of the gradient magnetic field pulse waveform shape, where FIG. 6(a) shows a case where the rising/falling is divided into two sections to perform approximation and FIG. 6(b) shows a case where the rising/falling is divided into three sections to perform approximation.

FIG. 7 shows diagrams illustrating the influence of the system response due to the pulse sequence difference, where FIG. 7(a) shows k-space sampling of the orthogonal system pulse sequence and FIGS. 7(b) and 7(c) show k-space sampling of the radial method pulse sequence.

FIG. 8 shows diagrams illustrating the influence of the system response given to an image of the radial method, where FIG. 8(a) shows a case where k-space correction is not performed and FIG. 8(b) shows a case where correction according to the present invention has been performed.

FIG. 13 shows diagrams illustrating optimal parameter evaluation determination in parameter search step, where each of FIGS. 13(a) and 13(b) is a diagram showing a phantom image reconstructed using a different approximation parameter and its profile taken along the A-A' line.

FIG. 18 shows diagrams showing the difference in image quality due to the approximation parameter difference, where FIG. 18(a) is a diagram showing a reference image and its profile and each of FIGS. 18(b) and 18(c) is a diagram showing an image reconstructed using a different approximation parameter and its profile.

DESCRIPTION OF EMBODIMENTS

Figure 1:
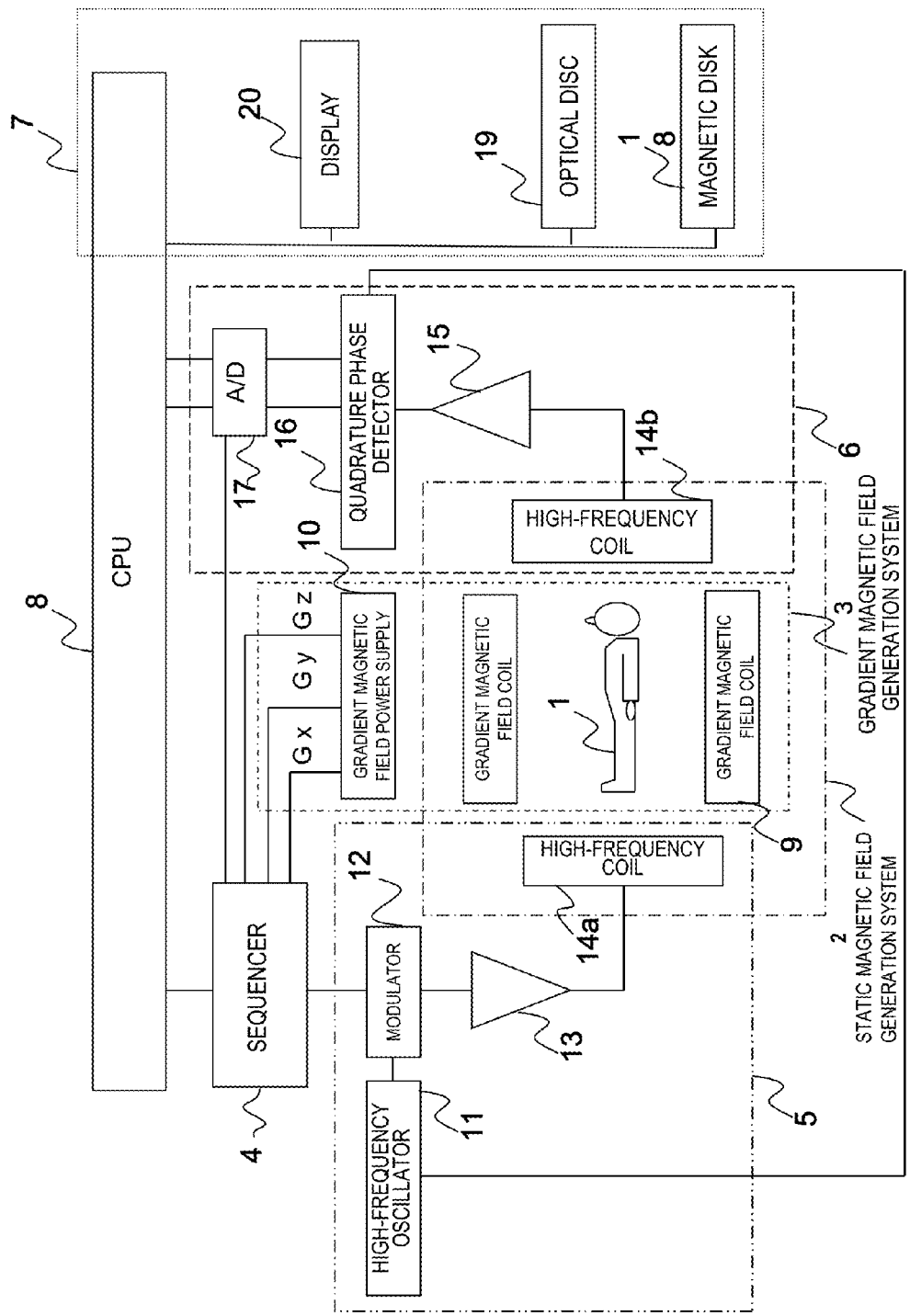
FIG. 1 is a block diagram showing the overall configuration of an example of an MRI apparatus to which the present invention is applied.

Hereinafter, embodiments of the present invention will be described with reference to the drawings. In addition, in all drawings for explaining the embodiments of the invention, the same reference numerals are given to components having the same functions, and repeated explanation thereof will be omitted.

FIG. 1 is a block diagram showing the overall configuration of an example of an MRI apparatus to which the present invention is applied. This MRI apparatus includes a static magnetic field generation system 2, a gradient magnetic field generation system 3, a signal transmission system 5, a signal receiving system 6, a signal processing system 7, a sequencer 4, and a central processing unit (CPU) 8.

The static magnetic field generation system 2 generates a uniform static magnetic field in space where an object 1 is placed, and is configured to include permanent magnet type, normal conducting type, or superconducting type magnetic field generation means. The shape or arrangement of the magnetic field generation means differs depending on the direction of the static magnetic field, such as a vertical magnetic field or a horizontal magnetic field.

The gradient magnetic field generation system 3 includes gradient magnetic field coils 9 wound in three axial directions of X, Y, and Z perpendicular to one another and a gradient magnetic field power supply 10 to drive each gradient magnetic field coil, and applies gradient magnetic fields Gx, Gy, and Gz in the three axial directions of X, Y, and Z, to the object 1 by driving the gradient magnetic field power supply 10 of each coil according to the command from the sequencer 4 to be described later. By the combination of these gradient magnetic fields, it is possible to select the imaging cross-section of the object 1 or to encode position information in the echo signal.

The sequencer 4 is control means for repeatedly applying a high-frequency magnetic field pulse (hereinafter, referred to as an "RF pulse") and a gradient magnetic field pulse according to a predetermined pulse sequence, and operates under the control of the CPU 8 and transmits various commands, which are required to collect the data of a tomographic image of the object 1, to the signal transmission system 5, the gradient magnetic field generation system 3, and the signal receiving system 6. Pulse sequences include not only the imaging sequence for acquiring the image of the object but also a preliminary measurement sequence for measuring the characteristics of an apparatus and the like. Various pulse sequences depending on the imaging method or the purpose of measurement are stored as programs in advance.

The signal transmission system 5 emits RF pulses to cause nuclear magnetic resonance in the nuclear spins of atoms that form the body tissue of the object 1, and is configured to include a high-frequency oscillator 11, a modulator 12, a high-frequency amplifier 13, and a transmission-side high-frequency coil 14a. High-frequency pulses output from the high-frequency oscillator 11 are amplitude-modulated by the modulator 12 at the timing according to the command from the sequencer 4, and the amplitude-modulated high-frequency pulses are amplified by the high-frequency amplifier 13 and are then supplied to a high-frequency coil 14b disposed adjacent to the object 1. As a result, electromagnetic waves (RF pulses) are emitted to the object 1.

The signal receiving system 6 detects an echo signal (NMR signal) emitted due to nuclear magnetic resonance of the nuclear spins, which form the body tissue of the object 1, and is configured to include a receiving-side high-frequency coil 14b, an amplifier 15, a quadrature phase detector 16, and an A/D converter 17. Electromagnetic waves (NMR signal) of the response of the object 1 induced by the electromagnetic waves emitted from the transmission-side high-frequency coil 14a are detected by the high-frequency coil 14b disposed adjacent to the object 1 and are amplified by the amplifier 15. Then, at the timing according to the command from the sequencer 4, the amplified signals are divided into signals of two systems perpendicular to each other by the quadrature phase detector 16, and each of them is converted into a digital amount by the A/D converter 17 and is transmitted to the signal processing system 7.

The signal processing system 7 includes an external storage device (storage device), such as an optical disc 19 and a magnetic disk 18, and a display 20, such as a CRT. When data from the signal receiving system 6 is input to the CPU 8, the CPU 8 executes processing, such as signal processing and image reconstruction, and displays a tomographic image of the object 1, which is the result of the processing, on the display 20 and also records the tomographic image on the magnetic disk 18 or the like of the external storage device. Hereinafter, the memory of the CPU 8 and the external storage device are collectively called a storage device. In addition to the processing results described above, parameters (approximation parameters) of the approximation function of the gradient magnetic field pulse waveform shape, which will be described later, are recorded in the storage device. These parameters include not only the values set in advance as adjustment values but also the parameter values calculated as operation results of the CPU 8.

In addition, in FIG. 1, the transmission-side high-frequency coil 14a, the receiving-side high-frequency coil 14b, and the gradient magnetic field coil 9 are provided in static magnetic field space of the static magnetic field generation system 2 disposed in space around the object 1.

Next, each embodiment of the imaging operation of the MRI apparatus with the above configuration will be described.

First Embodiment

The present embodiment is characterized in that a parameter (approximation parameter) of a function to approximate a gradient magnetic field pulse is stored in a storage device and the measurement-space (k-space) coordinates of the measured echo signal is calculated using the approximation parameter, thereby performing gridding. Hereinafter, the present embodiment will be described with reference to the flow of the imaging operation shown in FIG. 2.

First, when an imaging pulse sequence is determined, a gradient magnetic field pulse waveform is calculated (step 201). An echo signal is measured using the pulse sequence calculated in step 201 (step 202). As the pulse sequence, either an orthogonal system sampling method for sampling k-space in parallel to the axial direction or a non-orthogonal system sampling method for sampling k-space radially or spirally may be used.

Figure 3:
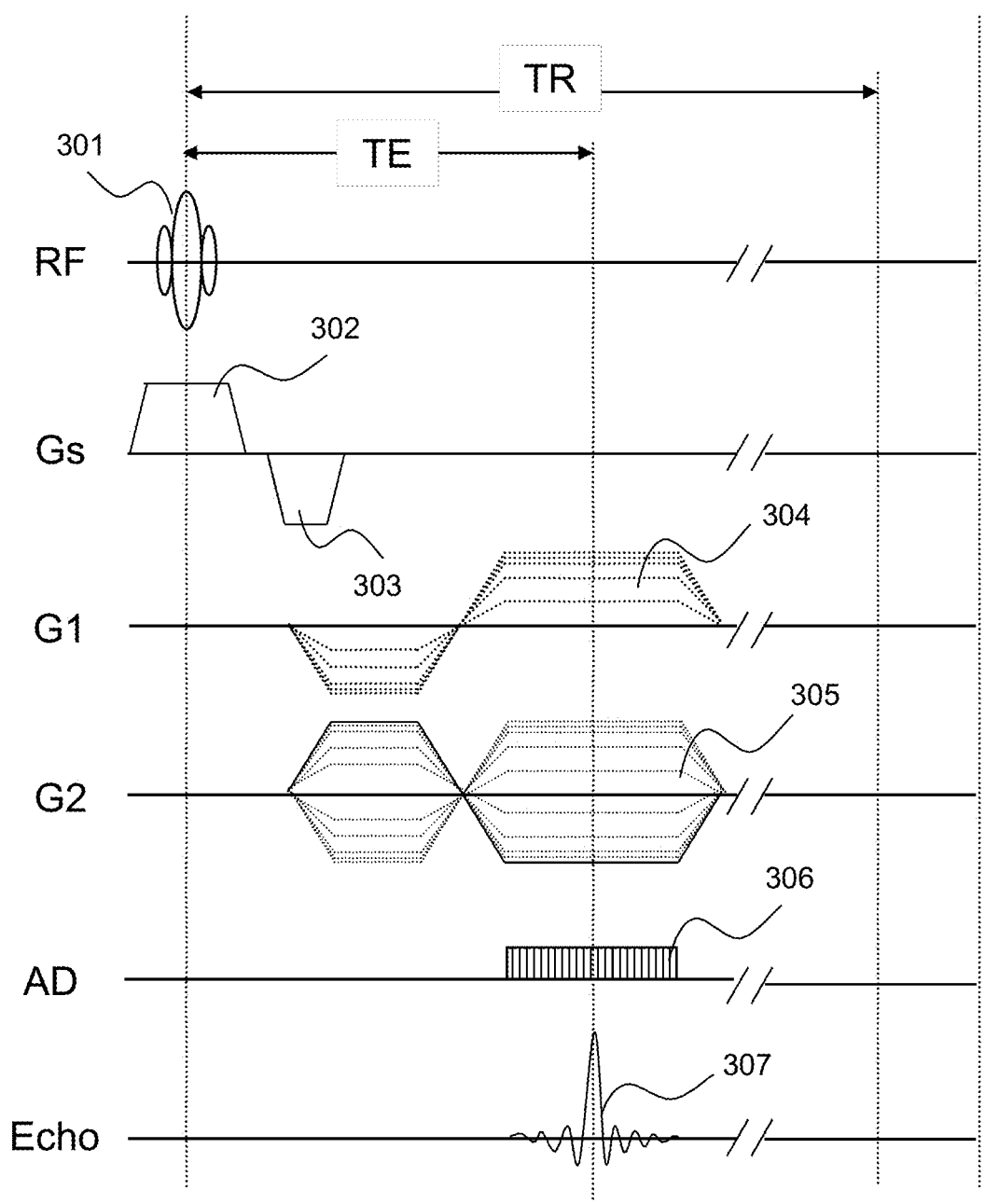
FIG. 3 is a timing chart showing the pulse sequence of a radial method.

As an example, a pulse sequence of a radial method, which is a kind of non-orthogonal system sampling method, is shown in FIG. 3. In FIG. 3, RF, Gs, G1, G2, A/D, and echo indicate an RE pulse, a slice gradient magnetic field, a readout gradient magnetic field in a first direction, a readout gradient magnetic field in a second direction, AD conversion, and echo signal application timing, respectively. In this pulse sequence, first, an RF pulse 301 and a slice selection gradient magnetic field pulse 302 are applied to excite a desired slice. Then, a slice rephase gradient magnetic field pulse 303 is applied, readout gradient magnetic field pulses 304 and 305 in two axial directions are applied in combination, and an echo signal 307 is measured in a sampling window 306 while readout gradient magnetic field pulses having reverse polarities are being applied. This measurement is repeated every repetition time TR, and the outputs of the first and second readout gradient magnetic field pulses 304 and 305 are gradually changed every repetition to acquire data required to reconstruct one image.

The data acquired in this manner is arranged in measurement-space (k-space) determined by the hysteresis of the readout gradient magnetic field applied until the data acquisition (k-space coordinates are assigned), but the k-space coordinates are shifted from the coordinates calculated in step 201 due to the influence of the system response of the gradient magnetic field. In order to correct this shift, k-space coordinates are calculated using the approximation function of the gradient magnetic field pulse waveform stored in a storage device (a memory or a storage device) 200 (step 203). k-space data, on which gridding processing is performed using the k-space coordinates calculated in step 203 and the signal measured in step 202, is generated (step 204).

Finally, a two-dimensional Fourier transform of the generated k-space data is performed to generate an image (step 205).

The present embodiment is characterized in that the signal processing system 7, which is signal processing means, includes approximation function generation means for generating an approximation function to approximate the gradient magnetic field pulse waveform for each of at least two temporally divided sections of the gradient magnetic field pulse waveform, to which magnetic field gradient is given by gradient magnetic field generation means, and correction means for correcting the measurement-space coordinates, at which an echo signal is arranged, using the approximation function and that a step of correcting the k-space coordinates, at which measured data (echo signal) is arranged, using an approximation function of the gradient magnetic field pulse waveform stored in the storage device 200 as an adjustment value in advance is included as a function. Hereinafter, details of step 203 will be described.

First, the approximation function of the gradient magnetic field waveform stored in the storage device 200 will be described.

There is the relationship of Expression (1) between the output G(t) of the readout gradient magnetic field pulse and the coordinates k(t) of k-space.

[Expression 1]

$$k(t) = \gamma \int_0^t G(t')dt' \quad (1)$$

In this Expression, γ indicates a gyromagnetic ratio.

As can be seen from Expression (1), k-space coordinates are given by integration of the gradient magnetic field pulse output. FIG. 4 shows the relationship between the readout gradient magnetic field pulse (304 and 305 in FIG. 3) and the sampling 306. As shown in FIG. 4(a), in the case of sampling when the waveform of the gradient magnetic field pulse is constant, the interval of the k-space coordinates is fixed. On the other hand, as shown in FIG. 4(b), in the case of sampling from rising to falling of a gradient magnetic field pulse 401, the interval of k-space coordinates in the rising and falling of the gradient magnetic field pulse 401 is dense compared with that in the case shown in FIG. 4(*a*), but it is influenced by the system response. In addition, the sampling method shown in FIG. 4(*b*) is called ramp sampling or nonlinear sampling. Since a larger number of sampling points can be acquired, an effect of an increase in spatial resolution or a reduction in gradient magnetic field pulse application time is obtained.

In the pulse sequence calculated in step 201, calculation is performed on the assumption that the gradient magnetic field pulse has an ideal shape as shown in FIG. 5(*a*). However, as shown in FIG. 5(*b*) or 5(*c*), there is a delay of the output response or a deformation of the rising or falling shape in the actual gradient magnetic field output. In the present embodiment, at least two approximation functions to approximate gradient magnetic field waveforms to be actually applied with the point of inflection of the rising or falling as a boundary are set, and the k-space coordinates are corrected using the parameters of these approximation functions.

For this reason, first, the gradient magnetic field waveform is divided into a plurality of sections and an approximation function to approximate the waveform is defined for each section. FIG. 6 shows an example of the sections of the divided gradient magnetic field waveform. In the example shown in the drawing, the gradient magnetic field waveform is divided into five sections, which are an early rising section 601-1, a late rising section 602-1, a constant section 603, an early falling section 602-2, and a late falling section 601-2 of the gradient magnetic field pulse, and the sections 601-1 and 602-1 are approximated by the functions expressed as in Expressions (2) and (3).

[Expression 2]

$$G_{start}(t) = a + b \times \frac{\exp(c \times t)}{\exp(c \times D_{start})} \quad (2)$$

In this Expression, $D_{start}$ is a time interval of the section 601-1, and can be determined to be several tens of percent of rising/falling time of the gradient magnetic field pulse, for example. a, b, and c are constants.

[Expression 3]

$$G_{end}(t) = d + e \times \left(1 - \frac{\exp(f \times (D_{end} - t))}{\exp(f \times D_{end})}\right) \quad (3)$$

In this Expression, $D_{end}$ is a time interval of the section 602-1. Similar to $D_{start}$, $D_{end}$ can be determined to be several tens of percent of rising/falling time of the gradient magnetic field pulse, for example. d, e, and f are constants.

The constants a, h, c, d, e, and f can be calculated from the echo signal measured in step 202. However, it is assumed herein that values calculated from the gradient magnetic field pulse waveform measured in advance by preliminary measurement are stored in the storage device 200 as parameters.

For the sections 601-2 and 602-2 of the falling portion, the functions of Expressions (2) and (3) are applied in the opposite direction. Alternatively, for the falling portion, it is also possible to define other approximation functions obtained by changing the constants a, b, c, d, e, and f in Expressions (2) and (3). In this manner, it is possible to improve the accuracy of approximation.

In addition, although the case where the gradient magnetic field waveform is divided into five sections and the rising and falling portions are respectively approximated using two functions of $G_{start}$ and $G_{end}$ has been described in FIG. 6(*a*), the method of dividing the gradient magnetic field waveform is not limited to the example shown in FIG. 6(*a*). For example, as shown in FIG. 6(*b*), it is also possible to divide each of rising and falling portions into three sections, define approximation functions expressed as in Expressions (2) and (3) for sections 604-1 and 606-1 and 604-2 and 606-2 in which the waveform changes in a nonlinear manner, and use a linear function expressed as $G_{const}$=gt (g is a constant) for sections 605-1 and 605-2 which are respectively located between the sections 604-1 and 606-1, and 604-2 and 606-2 and in which the waveform changes linearly.

When signal measurement (imaging) executed in step 202 is a pulse sequence of the radial method shown in FIG. 3, the readout gradient magnetic field pulses 304 and 305 in first and second directions are used. In this case, as an approximation parameter, it is possible to use an average value for the gradient magnetic field system of each axis. However, since the efficiency of an actual gradient magnetic field coil is different for each axis due to the difference in the shape, it is preferable to define the approximation function for each axis.

Figure 2:
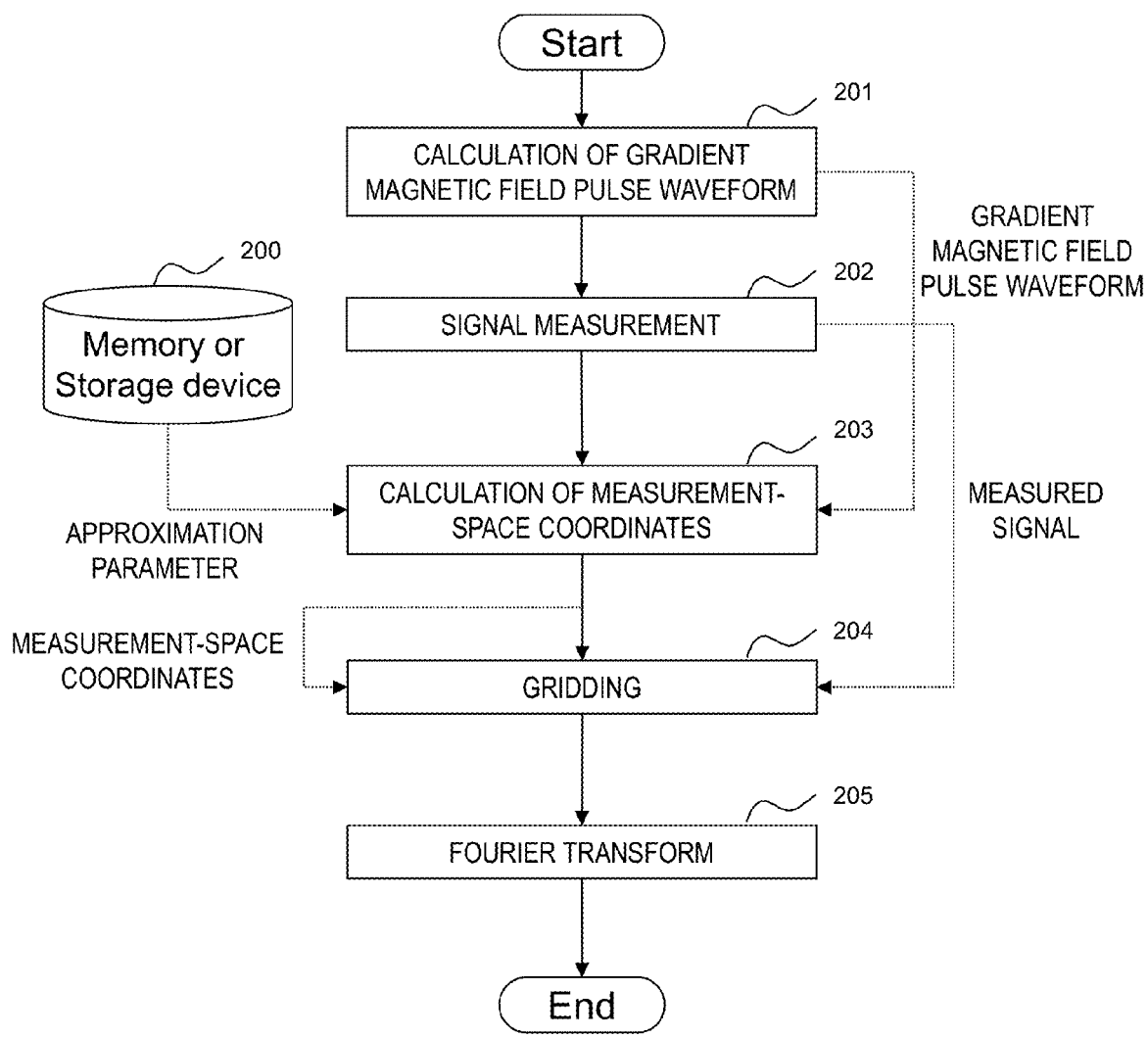
FIG. 2 is a flow chart showing the imaging operation according to a first embodiment.

In step 203 shown in FIG. 2, parameters of the above Expressions (2) and (3) stored in the storage device 200 are read out to calculate the coordinates of k-space. Specifically, using a function that approximates the gradient magnetic field pulse waveform for each section, integration of each section is executed as shown in Expression (4). As a result, k-space coordinates of the data sampled at time t are determined.

[Expression 4]

$$k(t) = \gamma \int_0^{D_{start}} G_{Rise\_start}(t')dt' + \\
\gamma \int_{D_{start}}^{D_{start}+D_{end}} G_{Rise\_end}(t')dt' + \gamma \int_{D_{start}+D_{end}}^{D_{start}+D_{end}+D_{flat}} G_{flat}(t')dt' + \\
\gamma \int_{D_{start}+D_{end}+D_{flat}}^{D_{start}+D_{end}+D_{flat}+D_{start}} G_{Fall\_start}(t')dt' + \\
\gamma \int_{D_{start}+D_{end}+D_{flat}+D_{start}}^{D_{start}+D_{end}+D_{flat}+D_{start}+D_{end}} G_{Fall\_end}(t')dt' \quad (4)$$

In this Expression, $G_{rise\_start}$ is the same function as $G_{start}$ in Expression (2), and $G_{rise\_end}$ is the same function as $G_{end}$ in Expression (3). Here, $G_{Fall\_start}$ and $G_{Fall\_end}$ are assumed to be functions when the directions of the change of the functions $G_{start}$ and $G_{end}$ are reverse, respectively. $G_{flat}$ is a constant value.

On the other hand, in step 202, data of the echo signal is collected at fixed sampling intervals. By applying the sampling time (t') of each piece of data to the above Expression (4), k-space coordinates at which each piece of data is arranged are calculated. When readout gradient magnetic fields of two axes are used, coordinates according to Expression (4) are calculated for each axis (for example, kx and ky). Points on k-space determined by the coordinates of two axes become the coordinates of the data.

In addition, in the MRI apparatus, in order to reconstruct an image by a fast Fourier transform, k-space coordinates are generally expressed as integers. However, since the k-space coordinates calculated by Expression (4) are not necessarily integers, conversion into data corresponding to the coordinates expressed as integers is performed using interpolation processing called gridding in step 204. Finally, a two-dimensional Fourier transform of the generated k-space data is performed to generate an image (step 205).

According to the present embodiment, a gradient magnetic field pulse waveform is divided into a plurality of sections, an approximation function is defined for each section, and k-space coordinates are calculated using each approximation function. Therefore, even if the system response of the gradient magnetic field cannot be approximated by one equivalent circuit, k-space coordinates are corrected using a waveform close to the actual gradient magnetic field output. As a result, it is possible to obtain an image in which the influence of error due to the system response has been reduced.

The present embodiment is suitable for the imaging method for performing data collection in the rising or falling of the readout gradient magnetic field as shown in FIG. 4B. In addition, although the pulse sequence can be applied to both imaging based on the orthogonal system sampling method and imaging based on the non-orthogonal system sampling method, the pulse sequence is particularly suitable for the non-orthogonal system sampling method in which the influence of the system response is likely to appear in a reconstructed image.

The difference in the effect of k-space coordinate correction according to the present embodiment, which is caused by the imaging method, will be described with reference to FIG. 7. FIG. 7(*a*) is a diagram showing a k-space data collection method according to the orthogonal sampling method, and FIGS. 7(*b*) and 7(*c*) are k-space data collection methods according to the radial method. FIG. 7(*b*) is a typical radial method to perform sampling from the outside of k-space to the outside through the center, and FIG. 7(*c*) is a method to read out an echo signal from the rising of the readout gradient magnetic field pulse and perform sampling from the center of k-space. In FIG. 7, the starting point of the linear arrow indicates the starting position of echo signal sampling and the end point of the linear arrow indicates the end position of the echo signal sampling, and the curved arrow indicates a sampling direction.

There are two kinds of influences of deviation from the trapezoidal shape of the rising and falling of the readout gradient magnetic field shown in FIGS. 5(*b*) and 5(*c*). One of the influences is deviation of the interval of k-apace (first influence), and the other influence is the shift of k-space (second influence). In the k-space data collection method shown in FIG. 7(*a*), the first influence is limited to the left end, that is, the high-frequency region of k-space, as shown as a gray range in the drawing. Accordingly, only the spatial resolution of the image is slightly reduced. In addition, the second influence is a shift of the peak position of the echo signal. However, since the sampling direction is parallel to the ky axis, peak shift occurs at the same position of each echo. There is no discontinuity among echoes. For this reason, a linear phase change occurs in the image after Fourier transform, but this is excluded from the absolute value image.

On the other hand, in the case of the radial method shown in FIG. 7(*b*), the first influence is small as in the case of orthogonal sampling since the first influence is limited to the high-frequency region of k-space as shown as a gray range in the drawing. For the second influence, however, since the echo signal sampling direction is different for each echo, the shift of the echo peak position becomes discontinuous among echoes, and this lowers image formation efficiency. In addition, in the case of the sampling method shown in FIG. 7(*c*), since the first influence occurs in the low-frequency region of k-space that determines the contrast of an image, significant image quality degradation occurs. Therefore, the effect of significant image quality improvement in the radial method shown in FIG. 7(*b*) or 7(*c*) is obtained by applying the present embodiment.

FIG. 8 shows the effect when performing k-space correction using an approximation parameter according to the present embodiment. FIG. 8 is a diagram showing an image when imaging a uniform phantom using the radial method shown in FIG. 7(*c*), where FIG. 8(*a*) is a case when there is no correction and FIG. 8(*b*) is a case when correction is performed. As is apparent from the drawings, a double image is generated and signal irregularities occur at the edge when there is no correction, but signal irregularities are eliminated and accordingly a uniform phantom image is obtained when correction is performed. In the present embodiment, at least two approximation functions may include different kinds of approximation functions, or at least one approximation function may be an exponential function and at least one approximation function may be a linear function. In addition, at least two approximation functions may have the same gradient between adjacent sections.

Second Embodiment

The imaging procedure of the present embodiment is the same as that in the first embodiment shown in FIG. 2, but is characterized in that an optimal approximation parameter is used by changing the parameter of the approximation function to approximate the gradient magnetic field waveform according to the imaging parameter calculated in step 201. That is, parameters of at least two approximation functions are changed according to the imaging conditions.

Among imaging parameters, as imaging parameters related to changes in the parameters of the approximation function, specifically, an imaging parameter that determines the strength of the readout gradient magnetic field pulse and a rising/falling time may be mentioned. Error in the gradient magnetic field pulse waveform shape reflects the characteristics of the gradient magnetic field system, and the characteristics of the gradient magnetic field system largely depend on the gradient magnetic field pulse strength. In addition, it may also be considered that the gradient magnetic field pulse waveform shape depends not only on the gradient magnetic field pulse strength but also on the rising/falling time of the gradient magnetic field pulse. In the present embodiment, therefore, correction can be performed more accurately by changing the approximation parameter according to these imaging parameters.

Also in the present embodiment, parameters of the approximation function of the gradient magnetic field pulse waveform are stored in the storage device 200 as in the first embodiment. The approximation function of the waveform is obtained by dividing the gradient magnetic field pulse waveform into a plurality of sections as shown in FIG. 6(*a*) or 6(*b*) and approximating the shape of each section with the functions expressed as in Expressions (2), (3), and the like. In the first embodiment, a to f in Expressions (2) and (3) are constants. In the present embodiment, however, these a to f are assumed to be values that change according to the gradient magnetic field strength and the rising time of the gradient magnetic field.

In addition, the gradient magnetic field pulse strength calculated by the imaging parameters is given by Expression (5).

[Expression 5]

$$G = \frac{BW}{\gamma \cdot FOV} \quad (5)$$

In this Expression, BW, γ, and FOV indicate a bandwidth, a gyromagnetic ratio, and an imaging field-of-view size, respectively. In addition, the rising/falling time of the gradient magnetic field pulse is determined when the pulse sequence is calculated in step 201.

In order to change the constants in Expressions (2) and (3) according to the gradient magnetic field pulse strength or the rising/falling time, combinations of a plurality of optimal approximation parameters are calculated in advance corresponding to each gradient magnetic field pulse strength or rising/falling time. The result calculated as described above is stored in the storage device 200. When calculating the k-space coordinates in step 203, the gradient magnetic field pulse strength or the rising/falling time is first calculated from imaging parameters used in actual imaging (step 202). Then, according to the calculated gradient magnetic field pulse strength or rising time, optimal approximation parameters are selected from the storage device 200 and are used to calculate the k-space coordinates. The method for calculating the k-space coordinates is the same as that in the first embodiment, and performing gridding (step 204) and image reconstruction (step 205) by Fourier transform thereafter is the same as that in the first embodiment.

In addition, instead of calculating the combination of a plurality of optimal approximation parameters corresponding to each gradient magnetic field pulse strength or rising/falling time, it is also possible to calculate the relationship between each gradient magnetic field pulse strength or rising time and each parameter (in the example of the first embodiment, constants a to f) of the waveform approximation function in advance and to calculate the optimal approximation parameter corresponding to each gradient magnetic field pulse strength or rising time on the basis of this relationship.

The relationship between each gradient magnetic field pulse strength or the rising/falling time and each constant of the waveform approximation function can be calculated by the following procedure, for example. First, two or more measurement points having different gradient magnetic field pulse strengths are set, and optimal approximation parameters are calculated for each gradient magnetic field pulse strength.

From this result, an approximation function is calculated for each constant and each gradient magnetic field pulse. For example, this approximation function can be determined by defining a function as a basis for each constant and optimizing the function as a basis by the least squares method using the result of the measurement points. As functions as a basis, there are a primary function, a secondary function, an exponential function, a logarithmic function, and the like.

A function of approximating the relationship between the rising/falling time of the gradient magnetic field pulse and each constant of the waveform approximation function can be similarly calculated. In addition, when the time interval ($D_{start}$ in Expression (2) or $D_{end}$ in Expression (3)) between the sections of the gradient magnetic field waveform is set on the basis of the gradient magnetic field rising/falling time, which empirically calculated, in approximating the gradient magnetic field pulse waveform, the time interval between these sections may also be changed on the basis of the rising/falling time of the gradient magnetic field pulse determined in step 201.

As described above, according to the present embodiment, a stable image can be obtained even when changing the imaging conditions by changing the optimal approximation parameters according to the imaging parameters in actual imaging.

Third Embodiment

The present embodiment is applied to an imaging method in which the readout gradient magnetic field is generated by combining the gradient magnetic field outputs of two or three axes, which are physically perpendicular to one another, as oblique imaging.

Figure 9:
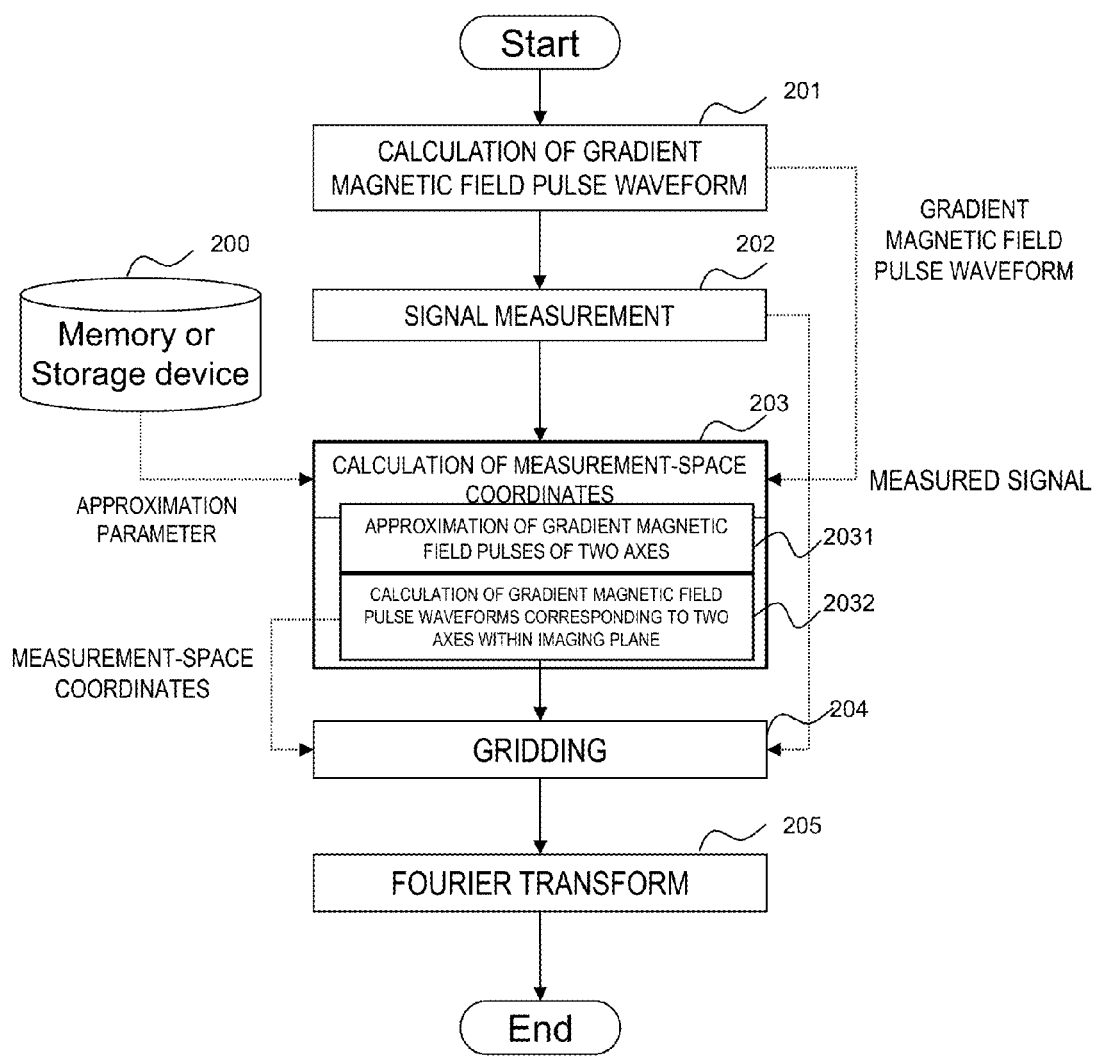
FIG. 9 is a flow chart showing the imaging procedure according to a third embodiment.

FIG. 9 shows the imaging procedure of the present embodiment. Also in the present embodiment, the imaging procedure is the same as the procedure in the first or second embodiment. However, the present embodiment is different from the first or second embodiment in that calculation for coordinate conversion (steps 2031 and 2032) described below is added to the calculation of k-space coordinates in step 203. The following explanation will be focused on the difference.

The output of the gradient magnetic field pulse at the time of oblique is given by the combination of each element of the pulse sequence at each time t. For example, for the sequence of the radial method shown in FIG. 3, assuming that the outputs of readout gradient magnetic field pulses of two axes are $G_{r1}(t)$ and $G_{r2}(t)$, the outputs of the physical axes (X/Y/Z) of the gradient magnetic field can be calculated by Expression (6).

[Expression 6]

$$\begin{pmatrix} G_x(t) \\ G_y(t) \\ G_z(t) \end{pmatrix} = \begin{pmatrix} c_{r1x} & c_{r2x} \\ c_{r1y} & c_{r2y} \\ c_{r1z} & c_{r2z} \end{pmatrix} \begin{pmatrix} G_{r1}(t) \\ G_{r2}(t) \end{pmatrix} \quad (6)$$

The coefficient c in Expression (6) can be generally expressed as a rotation matrix.

For the gradient magnetic field pulse waveforms $G_x(t)$, $G_y(t)$, and $G_y(t)$ of the respective axes calculated herein, approximation of the gradient magnetic field pulse waveform shape is performed (step 2031). That is, the gradient magnetic field pulse waveform of each axis is divided into a plurality of sections, and the approximation functions of Expressions (2) and (3) are applied, for example. Waveforms after approximation are assumed to be $G'_x(t)$, $G'_y(t)$, and $G'_z(t)$. That is, the waveforms after approximation can be expressed as in the following general Expression (7).

[Expression 7]

$$G'(t) = \begin{cases} G_{Rise\_start}(t) & 0 \le t < D_1 \\ G_{Rise\_end}(t) & D_1 \le t < D_2 \\ G_{flat}(t) & D_2 \le t < D_3 \\ G_{Fall\_start}(t) & D_3 \le t < D_4 \\ G_{Fall\_end}(t') & D_4 \le t < D_5 \end{cases} \quad (7)$$

$D_1 = D_{start}$
$D_2 = D_1 + D_{end}$
$D_3 = D_2 + D_{flat}$
$D_4 = D_3 + D_{start}$
$D_5 = D_4 + D_{end}$ Then, the gradient magnetic field pulse waveform corresponding to the two axes within the imaging plane is calculated by the following Expression (8) (step 2032).

[Expression 8]

$$\begin{pmatrix} G'_{r1}(t) \\ G'_{r2}(t) \end{pmatrix} = \begin{pmatrix} c_{r1x} & c_{r1y} & c_{r1z} \\ c_{r2x} & c_{r2y} & c_{r2z} \end{pmatrix} \begin{pmatrix} G'_x(t) \\ G'_y(t) \\ G'_z(t) \end{pmatrix} \quad (8)$$

Here, the gradient magnetic field pulse waveform calculated from Expression (6) is expressed as a sum of components when expanding $G_{r1}(t)$ and $G_{r2}(t)$ to each axis as expressed by Expression (9).

[Expression 9]

$$\begin{pmatrix} G_x(t) \\ G_y(t) \\ G_z(t) \end{pmatrix} = \begin{pmatrix} c_{r1x} \times G_{r1}(t) + c_{r2x} \times G_{r2}(t) \\ c_{r1y} \times G_{r1}(t) + c_{r2y} \times G_{r2}(t) \\ c_{r1z} \times G_{r1}(t) + c_{r2z} \times G_{r2}(t) \end{pmatrix} \quad (9)$$

Therefore, the approximation of the gradient magnetic field pulse waveform shape in step 2031 only has to be performed for each term of Expression (9). That is, assuming that the results after approximating $G_{r1}(t)$ and $G_{r2}(t)$ for the physical axes (X/Y/Z) of the gradient magnetic field are $G_{r1x}(t)$, $G_{r1y}(t)$, $G_{r1z}(t)$, $G_{r2x}(t)$, $G_{r2y}(t)$, and $G_{r2z}(t)$, respectively, gradient magnetic field pulse waveforms $G'_x(t)$, $G'_y(t)$, and $G'_z(t)$ after the approximation for the physical axes (X/Y/Z) of the gradient magnetic field are as follows.

[Expression 10]

$$\begin{pmatrix} G'_x(t) \\ G'_y(t) \\ G'_z(t) \end{pmatrix} = \begin{pmatrix} c_{r1x} \times G_{r1x}(t) + c_{r2x} \times G_{r2x}(t) \\ c_{r1y} \times G_{r1y}(t) + c_{r2y} \times G_{r2y}(t) \\ c_{r1z} \times G_{r1z}(t) + c_{r2z} \times G_{r2z}(t) \end{pmatrix} \quad (10)$$

Integrating the amount of application of the gradient magnetic field waveform for each section using the gradient magnetic field pulse waveform corresponding to the two axes within the calculation imaging plane calculated by Expression (8) and calculating the k-space coordinates by Expression (11) in step 2032 are the same as in the first embodiment (step 2033).

[Expression 11]

$$k(t) = \gamma \int_0^{D_1} G_{Rise\_start}(t')dt' + \\ \gamma \int_{D_1}^{D_2} G_{Rise\_end}(t')dt' + \gamma \int_{D_2}^{D_3} G_{flat}(t')dt' + \\ \gamma \int_{D_3}^{D_4} G_{Fall\_start}(t')dt' + \gamma \int_{D_4}^{D_5} G_{Fall\_end}(t')dt' \quad (11)$$

In addition, when the readout gradient magnetic field pulse spans three axes in three-dimensional measurement or the like, the above can be applied by rewriting the above Expressions (6) and (8) as follows.

[Expression 12]

$$\begin{pmatrix} G_x(t) \\ G_y(t) \\ G_z(t) \end{pmatrix} = \begin{pmatrix} c_{r1x} & c_{r2x} & c_{r3x} \\ c_{r1y} & c_{r2y} & c_{r3y} \\ c_{r1z} & c_{r2z} & c_{r3z} \end{pmatrix} \begin{pmatrix} G_{r1}(t) \\ G_{r2}(t) \\ G_{r3}(t) \end{pmatrix} \quad (12)$$

[Expression 13]

$$\begin{pmatrix} G'_{r1}(t) \\ G'_{r2}(t) \\ G'_{r3}(t) \end{pmatrix} = \begin{pmatrix} c_{r1x} & c_{r1y} & c_{r1z} \\ c_{r2x} & c_{r2y} & c_{r2z} \\ c_{r3x} & c_{r3y} & c_{r3z} \end{pmatrix} \begin{pmatrix} G_x(t) \\ G_y(t) \\ G_z(t) \end{pmatrix} \quad (13)$$

As described above, according to the present embodiment, also in the oblique imaging, k-space coordinates can be corrected so as to eliminate the system error of the gradient magnetic field output by using the approximation function of the gradient magnetic field pulse waveform shape. As a result, it is possible to obtain an image with little image quality degradation.

In the above first to third embodiments, the case has been described in which optimal approximation functions (approximation parameters) stored in the storage device 200 are stored and the approximation parameters stored in the storage device are applied as they are or applied after being changed according to the actual imaging parameters or the imaging cross-section when correcting the gradient magnetic field response of the k-space coordinates at which the echo signal (sampling data) obtained by imaging is arranged. In the following embodiments, an MRI apparatus will be described which includes means for calculating the approximation parameter of the optimal gradient magnetic field pulse waveform on the basis of the shape of the gradient magnetic field pulse waveform used in the pulse sequence. The configuration and the imaging procedure of the apparatus are the same as those in the first to third embodiments.

Fourth Embodiment

Figure 10:
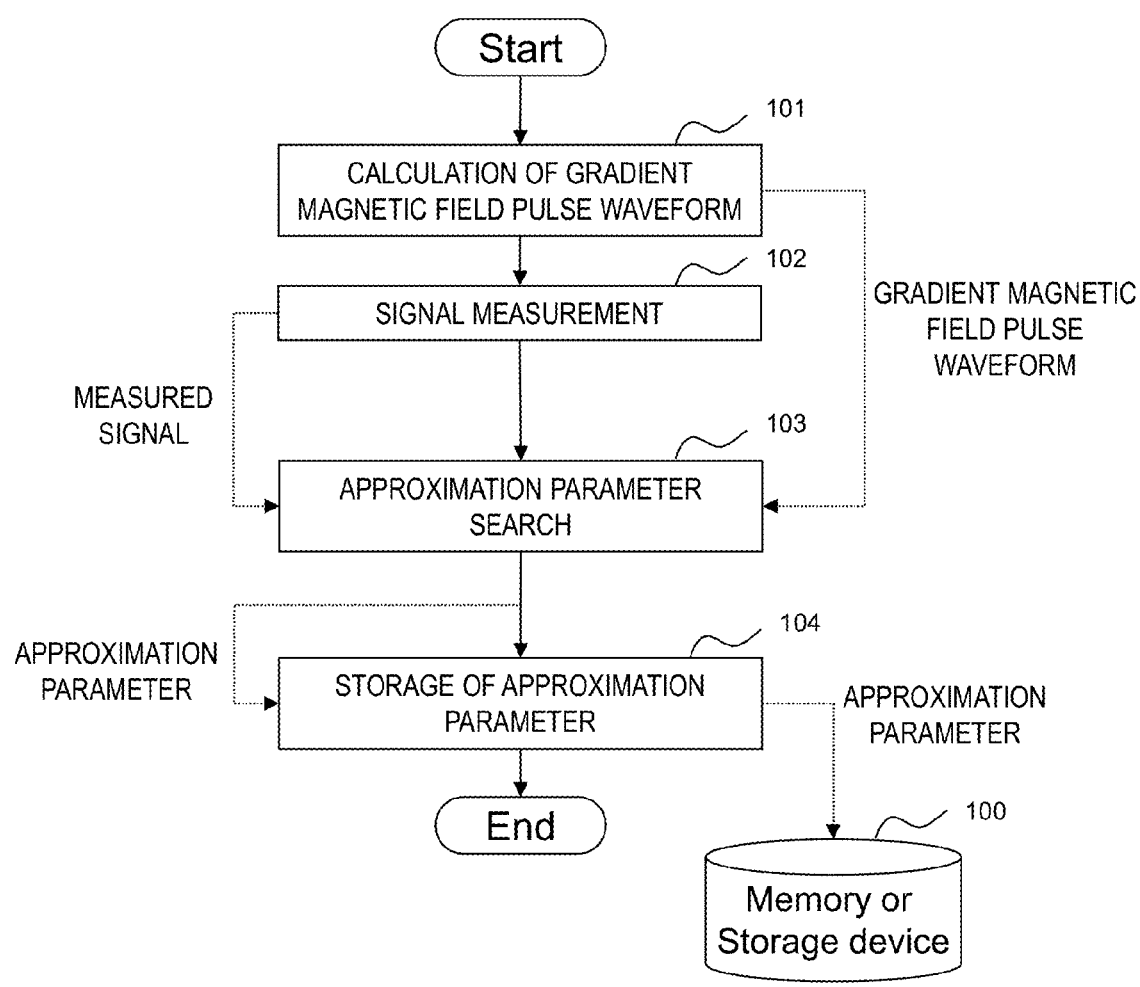
FIG. 10 is a flow chart showing the parameter search procedure according to a fourth embodiment.

FIG. 10 shows the procedure of calculating the optimal approximation parameter according to the present embodiment.

First, a pulse sequence of preliminary measurement is calculated (step 101). The pulse sequence of preliminary measurement may be the same as or different from the pulse sequence of main measurement as long as it is a pulse sequence using the same readout gradient magnetic field as in the pulse sequence of main measurement to acquire an image of the object. Here, a case will be described in which both the pulse sequences of main measurement and preliminary measurement are pulse sequences of the radial method. In the pulse sequence of the radial method, since readout gradient magnetic fields in two axial directions are used as shown in FIG. 3, an optimal approximation parameter is searched for each of the readout gradient magnetic fields.

The pulse sequence calculated in step 101 is executed to measure a signal (step 102). In order to perform search result evaluation to be described later, it is preferable to perform this measurement using a uniform phantom. Using the signal measured in step 102, an optimal approximation parameter of the gradient magnetic field pulse waveform in each axial direction is searched for (step 103). The approximation parameter found in step 103 is stored in a storage device (a memory or a storage device) 100 (step 104). Since the subsequent procedure in the main measurement is the same as the imaging procedure (steps 201 to 205 in FIG. 2) in the first embodiment, explanation herein will be omitted.

Figure 11:
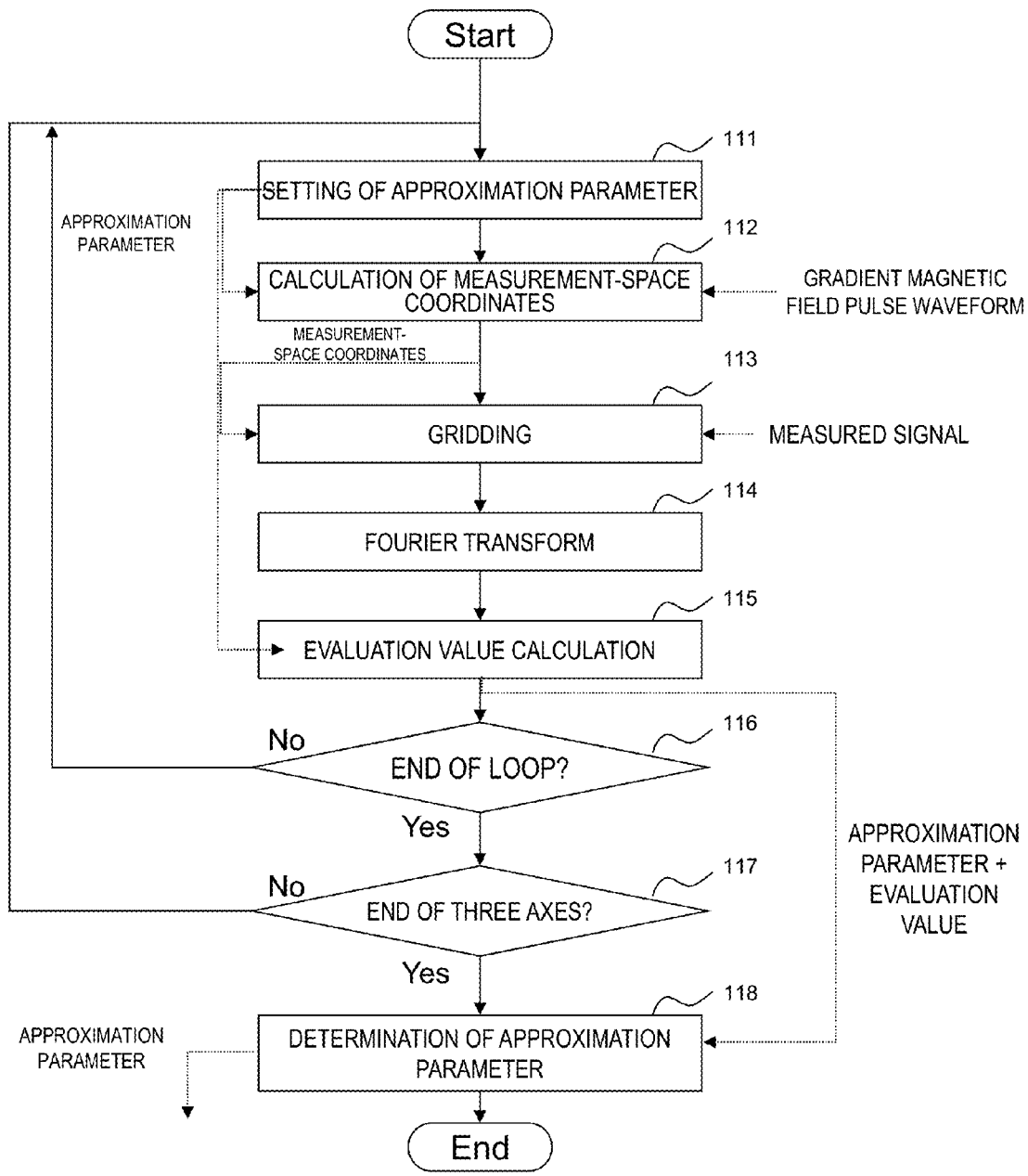
FIG. 11 is a flow chart showing the details of the search step in FIG. 10.

Hereinafter, optimal approximation parameter search step 103, which is the feature of the present embodiment, will be described with reference to FIG. 11. FIG. 11 is a flow showing the details of step 103.

First, the initial value of the approximation parameter is set (step 111). As examples of the initial value, it is possible to use the constants a to f, which are empirically calculated, of the approximation functions of Expressions (2) and (3) described in the first embodiment.

Figure 12:
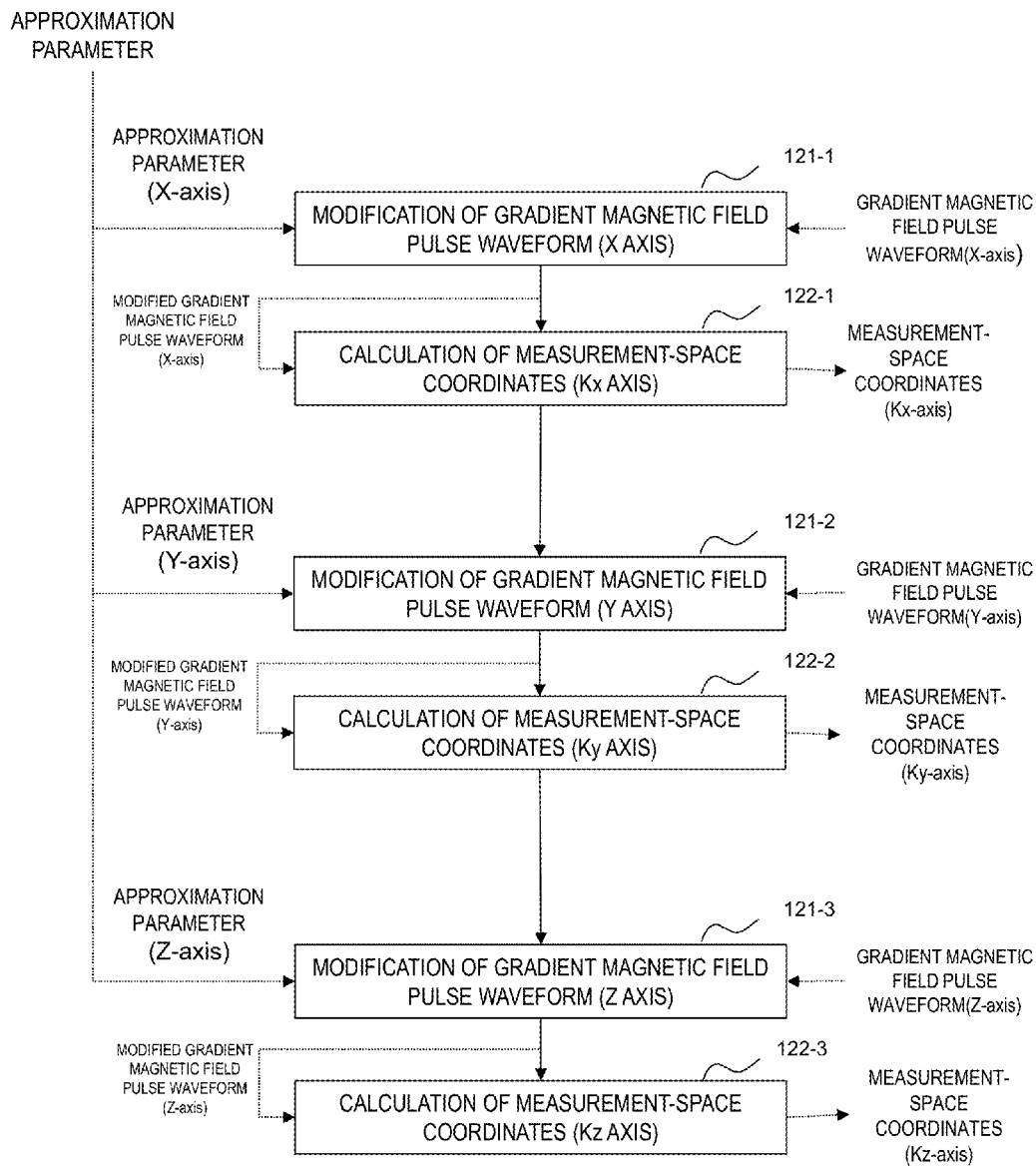
FIG. 12 is a diagram showing the details of the measurement-space coordinate calculation step in FIG. 11.

Then, the coordinates of measurement-space are calculated on the basis of the approximation parameter set in step 111 and the gradient magnetic field pulse waveform generated in step 101 of FIG. 10 (112). Specifically, as shown in FIG. 12, the approximation parameter is first applied to the input gradient magnetic field pulse waveform to acquire a gradient magnetic field pulse waveform after modification (step 121). Then, the coordinates of measurement-space are calculated, from the gradient magnetic field pulse waveform modified in step 121, by Expression (1) (step 122). These steps 121 and 122 are executed for the gradient magnetic field pulse waveforms of two axes. Although the calculation example for three axes of the X, Y, and Z axes is shown in FIG. 12, calculation only has to be performed for two of these three axes in the case of one pulse sequence based on the radial method. In addition, when the axis of the readout gradient magnetic field matches one of the physical axes by the pulse sequence, coordinate calculation only has to be performed for the one matched axis. Since the coordinate calculation can be independently executed for each axis, the order of calculation is not limited to that shown in the drawing.

Referring back to FIG. 11, data of measurement-space is generated by gridding processing using the measurement signal measured in step 102 of FIG. 10 and the measurement-space coordinates calculated in step 112 (step 113). Then, a Fourier transform of the data after gridding is performed to generate an image (step 114).

An improvement in the image quality due to the approximation parameter is evaluated on the basis of the generated image (step 115).

For example, the improvement in the image quality is evaluated from the profile shape of the image reconstructed from the signal measured using a phantom in step 101. FIG. 13 shows an example of the image quality criterion. FIGS. 13(a) and 13(b) are diagrams showing reconstructed images when k-space coordinates have been corrected using different approximation parameter combinations. In the drawings, the left shows an image and the right shows the signal strength profile of the image taken along the A-A' line. This image is a uniform phantom. In the signal strength profile, therefore, the signal value is ideally constant in a region where the phantom is present. In addition, the signal value of a portion where no phantom is present is zero. In the drawing, however, lifting of the signal can be seen at the phantom edge. In addition, the signal strength is high at the center of the phantom, and decreases toward the outer side. Such signal lifting in the edge of the image is defined as "Overshoot" and the signal uniformity inside the phantom is defined as "Uniformity", and these are calculated for each approximation parameter. As examples of the value of "Overshoot", the average value or the maximum value of the signal in the ROI set in the edge may be used. As examples of the value of "Uniformity", the standard deviation of the signal in the ROI set in the region where the phantom is present may be used. In addition, it is determined that the image quality has been improved when the value of "Overshoot" is reduced or the value of "Uniformity" is reduced by changing the approximation parameter.

The above steps 111 to 115 are repeated while changing the approximation parameter. The approximation parameter change may be performed for each of the plurality of approximation parameters (a to f), or the combination of a plurality of approximation parameters may be changed for each of the plurality of approximation functions (for example, functions of Expressions (2) and (3)). It is preferable to perform the approximation parameter change in a state where the parameter value search range and the interval or the number of searches of the value to be searched for are determined. In addition, in order to shorten the search time, changes, such as searching for the optimum value of only a parameter with a large degree of influence or increasing the number of times of search for a parameter with a large degree of influence, may be also be performed in consideration of the magnitude of the degree of influence of the approximation parameter on the image quality.

In addition, time interval D (for example, $D_{start}$ in Expression (2) or $D_{end}$ in Expression (3)) among respective divided sections of the gradient magnetic field pulse waveform shape may be added as a parameter. For example, in the example shown in FIG. 6(b), duration time $D_{start}$ and $D_{end}$ of the early and late rising/falling sections 604 and 606 of the gradient magnetic field pulse can be made variable, and each value can be changed so as to satisfy the relationship of Expression (14).

[Expression 14]

$$D_{start} + D_{const} + D_{end} = \text{RiseTime} \tag{14}$$

In this Expression, RiseTime is a rising/falling time of the gradient magnetic field pulse obtained from the calculation of step 101.

For each repetition of the search loop of steps 111 to 115, it is determined whether or not all combinations of the approximation parameters have been calculated (step 116). If the result in the determination of step 116 is "No", steps 111 to 115 are repeated again. When all combinations are calculated, the axis of the readout gradient magnetic field is changed, and the optimal parameter of the approximation function of the gradient magnetic field pulse waveform of the different axis is searched for.

When the target pulse sequence is a pulse sequence of the radial method in step 101 of gradient magnetic field pulse waveform calculation and step 102 of signal measurement, approximation parameters corresponding to the gradient magnetic field axes of three axes can be searched for by performing two measurements. For example, the Z axis of the gradient magnetic field is assigned as a slice selection gradient magnetic field axis and the remaining X and Y axes are assigned as gradient magnetic field axes within the slice surface in the first measurement, and the Y axis of the gradient magnetic field is assigned as a slice selection gradient magnetic field axis and the remaining X and Z axes are assigned as gradient magnetic field axes within the slice surface in the second measurement. As a result, approximation parameters with respect to the X and Y axes are determined from the first measurement, and approximation parameters with respect to the Z axis are determined from the second measurement. Depending on a pulse sequence, measurement is performed for each of X, Y, and Z, and an approximation parameter for each axis is determined. The search order of the axes is executed in the order of X, Y, and Z axes, for example. However, the search order of the axes is not limited to this, and the optimal order may be determined according to the hardware configuration of the apparatus.

It is determined whether or not the above has been completed for all axes to search for the approximation parameter (step 117). If the result is "No", steps 111 to 116 are repeated again. If the result is "Yes", a combination showing the most improvement in image quality among the evaluation values calculated in step 115, for example, a combination that gives the smallest "Overshoot" value and "Uniformity" value is determined and output as an optimal approximation parameter. The approximation parameter found in this manner is stored in the storage device 100 (FIG. 10), and is applied to the operation to correct the k-space coordinates in the main measurement performed subsequently.

According to the present embodiment, since the approximation parameter of each axis of the gradient magnetic field is calculated in preliminary measurement and the approximation parameter is reflected on the data in the main measurement, an image with less artifacts can be obtained even at the time of imaging cross-section change or oblique imaging.

Fifth Embodiment

Although the present embodiment is the same as the above-described fourth embodiment in that the approximation parameter of each axis of the gradient magnetic field is calculated by preliminary measurement, the present embodiment is characterized in that searching is performed over a plurality of divided steps.

Figure 14:
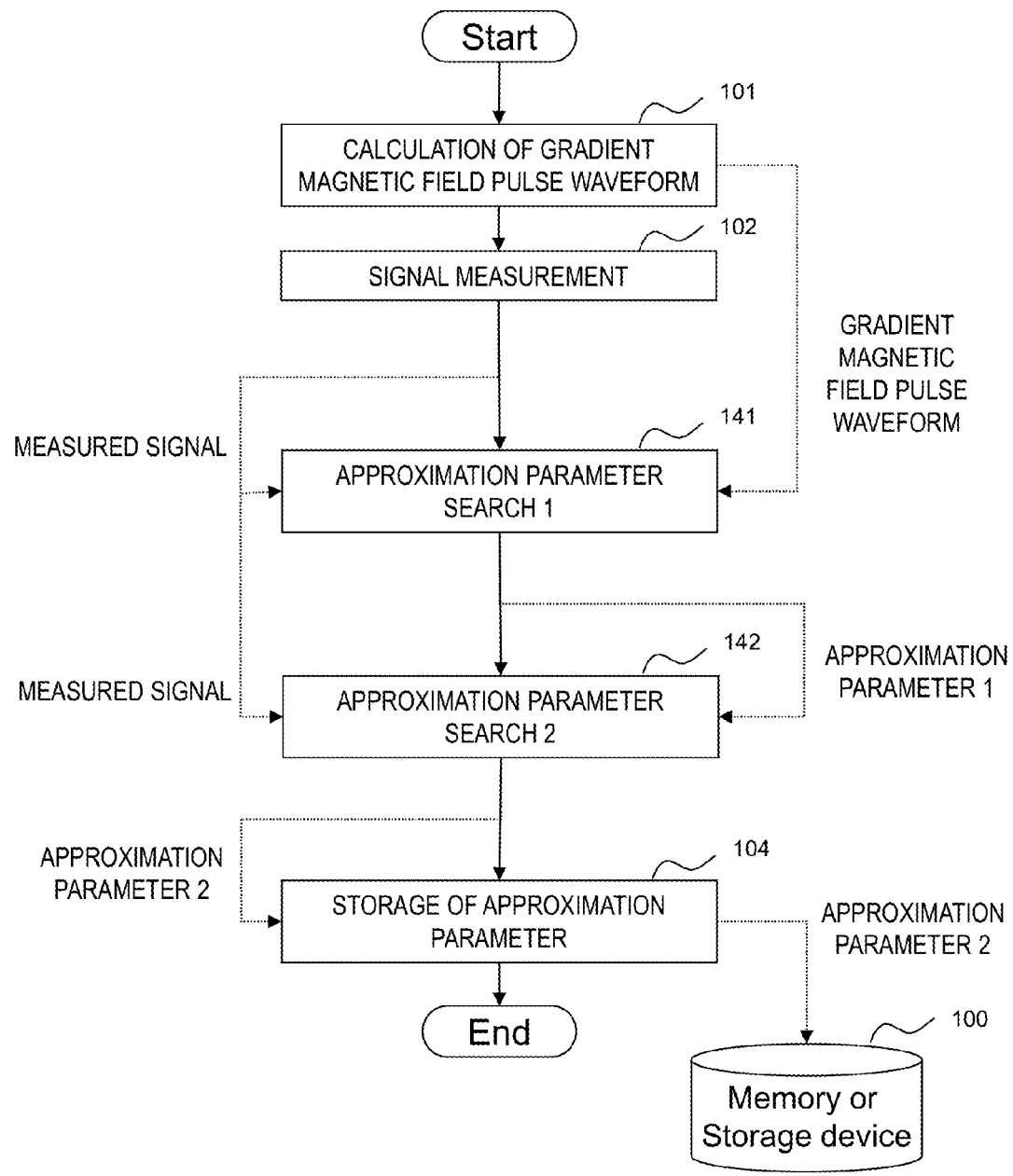
FIG. 14 is a flow chart showing the parameter search procedure according to a fifth embodiment.

FIG. 14 shows the approximation parameter search procedure according to the present embodiment. In FIG. 14, in steps denoted by the same reference numerals as in FIG. 10, the same processing as in steps of FIG. 10 is performed. FIG. 14 is different from FIG. 10 in that there are two approximation parameter search steps 141 and 142. Between these two approximation parameter search steps, the parameter search range when calculating the approximation parameter is different.

First, in step 141, optimal approximation parameters are searched for in the same manner as in the fourth embodiment using the gradient magnetic field pulse waveform of the pulse sequence generated in step 101 and the measurement signal measured in step 102 (that is, processing shown in FIG. 11 is performed). The optimal approximation parameter found in step 1402 is set as an approximation parameter 1.

In step 142, with the approximation parameter 1 found in step 1401 as a reference, approximation parameters are searched for at a finer pitch (the amount of changing the parameter for each loop in FIG. 11) than in step 141. For example, the pitch used in the approximation parameter search of the second search step 142 is set to 1/10 of the pitch used in the first search step 141. Processing in this case is also the same as the processing shown in FIG. 11. The optimal approximation parameter found in this manner in the second search step 142 is set as an approximation parameter 2.

Finally, the found approximation parameter 2 is recorded in the storage device 100 in step 104.

Then, it is the same as in each embodiment described above that k-space coordinates are calculated for the measurement signal actually measured using this approximation parameter and an image is reconstructed.

As described above, according to the present embodiment, since the approximation parameter search step is divided into two steps to search for approximation parameters at different pitches, possible to search for the optimal parameter efficiently and without reducing the accuracy rather than searching for the optimal parameter at a fine pitch from the beginning.

Sixth Embodiment

Although the present embodiment is the same as the above-described fourth and fifth embodiments in that the approximation parameter of each axis of the gradient magnetic field is calculated by preliminary measurement, the present embodiment is characterized in that determination when acquiring the optimal approximation parameter is performed on the basis of a reference image.

Figure 15:
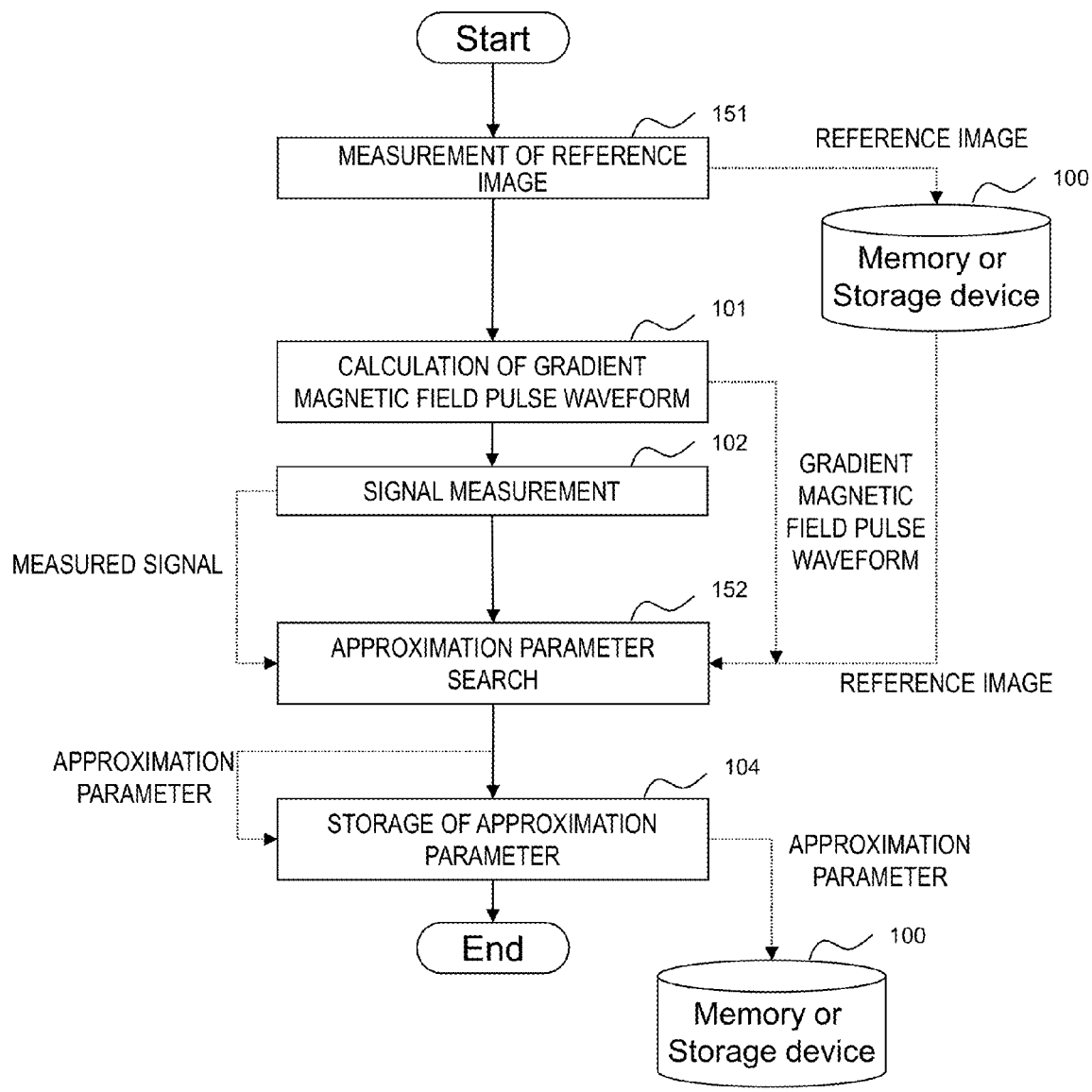
FIG. 15 is a flow chart showing the parameter search procedure according to a sixth embodiment.

FIG. 15 shows the imaging procedure of the present embodiment. FIG. 15 is different from FIG. 10 in that there is a step of reference image measurement. First, a pulse sequence for a reference image is calculated and signal measurement is performed (step 151). At this time, the acquired reference image is stored in the storage device 100 (FIG. 15). Then, a pulse sequence of preliminary measurement is calculated as in the fourth embodiment (step 101), and signal measurement is performed (step 102). Then, the optimum value of the approximation parameter is searched for using the reference image, which has been acquired in step 151 and stored in the storage device 100, the measurement signal measured in step 102, and the gradient magnetic field pulse waveform calculated in step 101 (step 152).

Figure 16:
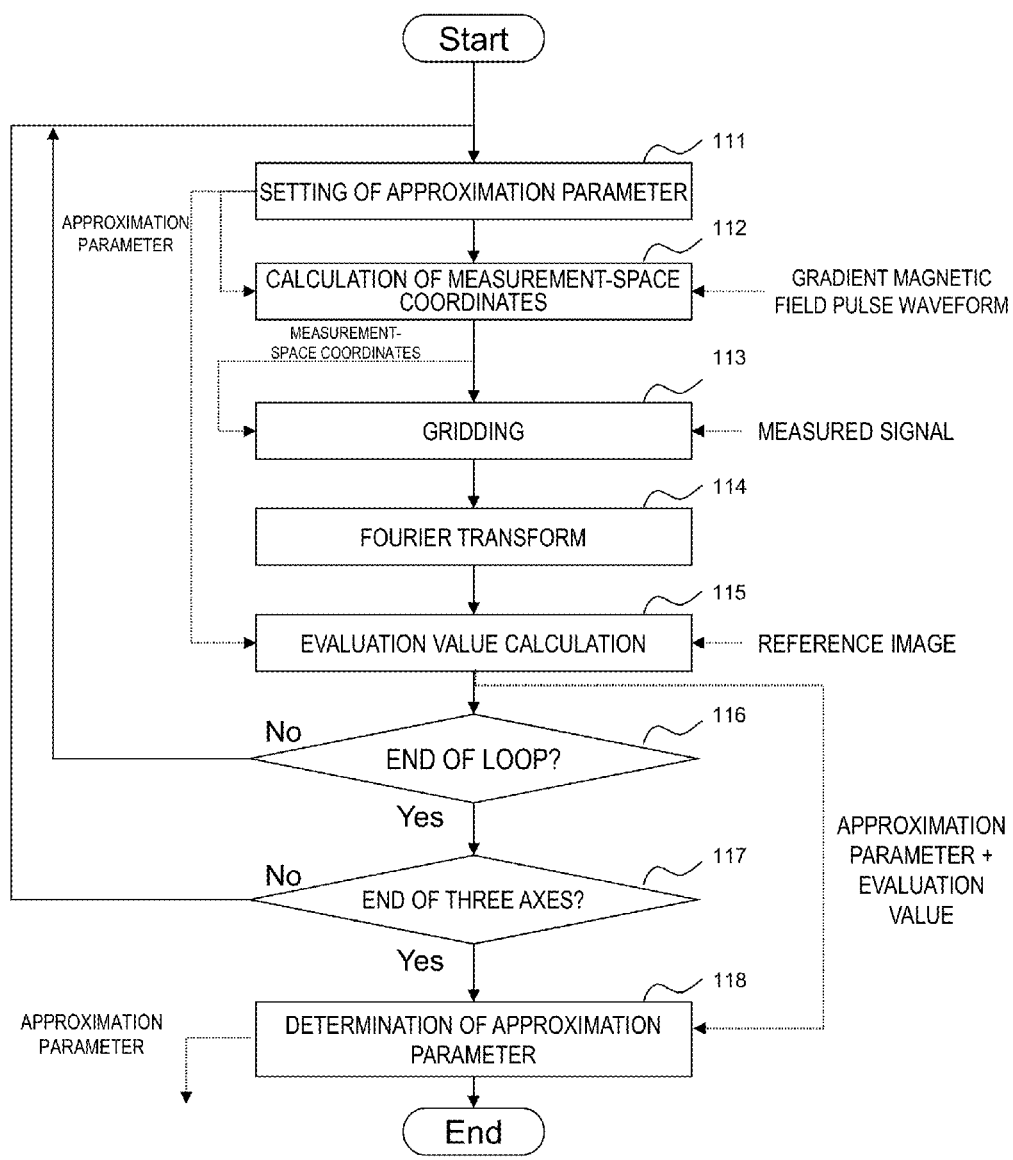
FIG. 16 is a flow chart showing the details of the search step in FIG. 15.

FIG. 16 shows the processing in step 152. The difference from the processing in FIG. 11, which has been described in the fourth embodiment, is the processing of approximation parameter evaluation value calculation step 161. Generally, in addition to the influence of the error of the gradient magnetic field pulse waveform shape, the influence of the transmission sensitivity or the reception sensitivity is included in the image obtained by the MRI apparatus. In order to evaluate such factors and the influence of the error of the gradient magnetic field pulse waveform shape separately from each other, an image as a reference is prepared and a deviation from the image is evaluated in the present embodiment. As a reference image, it is possible to use an image captured by the pulse sequence based on the orthogonal system sampling less affected by the error of the readout gradient magnetic field, for example, an image captured by the normal gradient echo sequence.

The degree of matching between such a reference image and the image obtained in step 114 is evaluated. In order to evaluate the degree of matching, for example, a similarity may be used. For this reason, a pixel value vector R in the reference image and a pixel value vector I of the image to be evaluated are defined in Expression (15).

[Expression 15]

$$\begin{cases} \vec{R} = (R_1, R_2, \ldots, R_N) \\ \vec{I} = (I_1, I_2, \ldots, I_N) \end{cases} \quad (15)$$

The similarity is calculated by the following calculation.

[Expression 16]

$$g = \frac{\sum_{k=1}^{N}(R_k - \bar{R})(I_k - \bar{I})}{\sqrt{\sum_{k=1}^{N}(R_k - \bar{R})^2 \times \sum_{k=1}^{N}(I_k - \bar{I})^2}} \quad (16)$$

Figure 17:
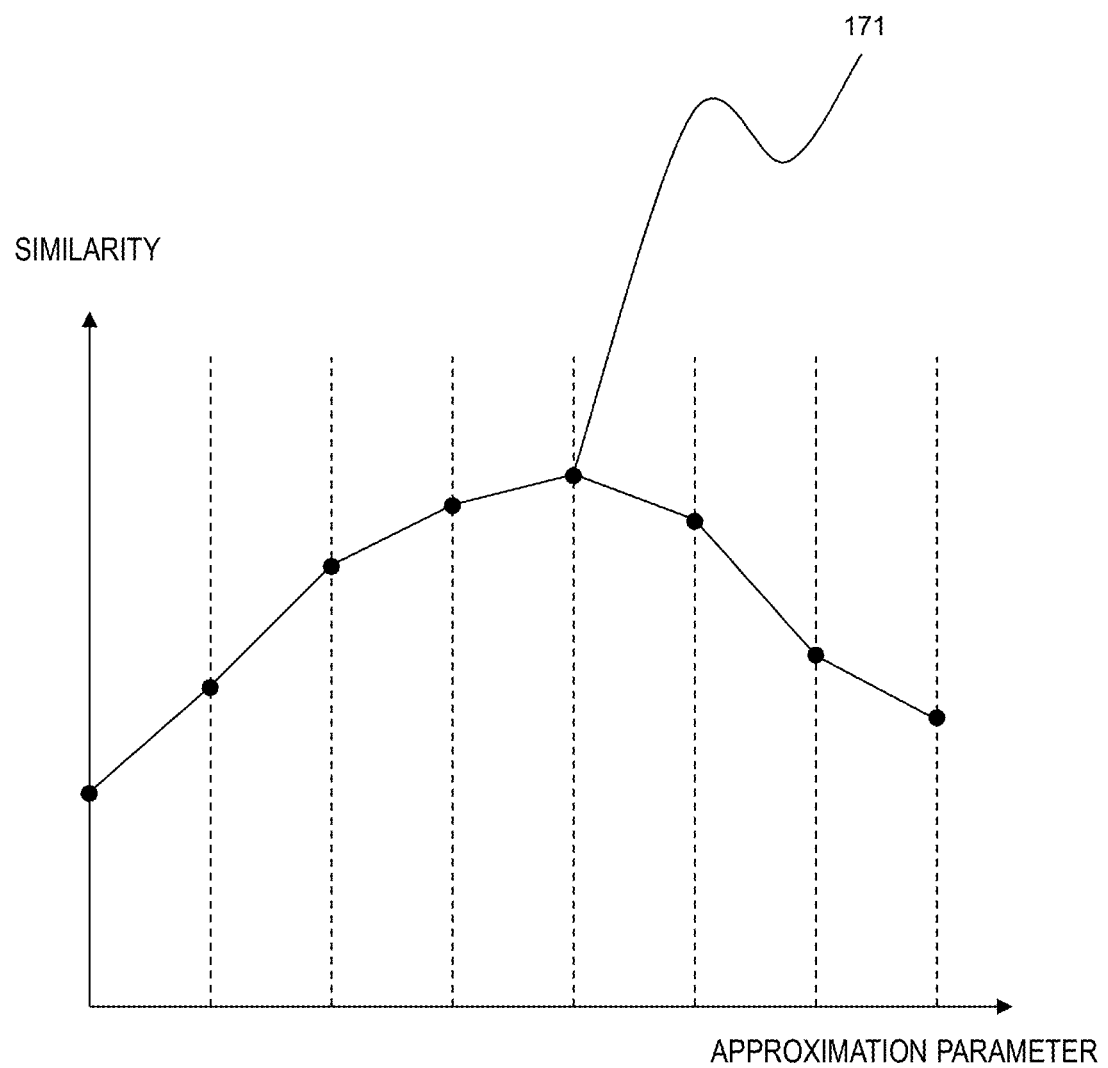
FIG. 17 is a graph showing the relationship between the approximation parameter and the image similarity in the sixth embodiment.

Thereafter, similar to the fourth embodiment, the approximation parameter used in step 112 is changed and the above-described steps 112 to 115 are repeated a predetermined number of times to obtain the similarities of the number of times, and the approximation parameter used when the similarity is highest is set as an optimal approximation parameter. FIG. 17 schematically shows the relationship between the similarity and the approximation parameter. From FIG. 17, it can be determined that a point 171 of the highest similarity is the optimum value of the approximation parameter. In addition, the image reconstructed at the k-space coordinates corrected using the approximation function of the approximation parameter determined to be the optimum value is a target image of the main measurement.

In addition, instead of using the entire mage for the similarity, the specific range of an image may be evaluated using the similarity. In this case, the region of interest (ROI) in the image only has to be set to restrict the calculation range of the pixel value vector used in the calculation of Expressions (15) and (16). In this case, the ROI may be not only the plane but also the line. In addition, when the range of the influence on the image changes with the approximation parameter, the ROI may be set in a region with the highest degree of influence. For example, the ROI is set near the center of the image when evaluating the approximation parameter that influences the degree of uniformity of the image, and the ROI is set near the edge of the image when evaluating the approximation parameter that influences the image formation efficiency in the end of the image.

FIG. 18 shows an example of the reconstructed image generated according to the present embodiment. FIG. 18(a) is an image (reference image) captured by the gradient echo sequence in normal imaging, and FIGS. 18(b) and 18(c) are images obtained by reconstructing the data, which is acquired by the gradient echo sequence of the radial method, using different approximation functions. The graph on the right side in each drawing shows the signal strength profile on the line (indicated by the dotted line) set in the middle of the image. As shown in FIGS. 18(b) and 18(c), the signal strength profile of the image changes due to the approximation parameter difference. From this, it can be seen that the optimal approximation parameter can be determined by evaluating the degree of matching between each image generated using different approximation parameters and the reference image (in this example, an image shown in FIG. 18(a)).

According to the present embodiment, it is possible to evaluate the optimal approximation parameter quantitatively by evaluating approximation parameters on the basis of a reference image.

While the embodiments of the present invention have been described, the present invention is not limited to the content disclosed in each of the embodiments described above, and various embodiments based on the spirit of the present invention may be adopted. For example, although the gradient echo type radial method has been described in the above embodiments, the radial method does not depend on the type of pulse sequence, but application to the spin echo type radial method is also possible.

In addition, although the examples of the radial method have been shown in the above embodiments, these are also effective for a case where non-linear measurement (FIG. 4(b)) is used in combination even if the orthogonal system sampling is applied or a case where echo signals are acquired asymmetrically. Furthermore, in addition to the normal radial method, the present invention may also be applied to a radial method for asymmetrical echo measurement in which sampling is performed from the center of measurement-space toward the outside. In addition, the present invention may also be similarly applied to a radial method in which sampling is performed from the outside of measurement-space toward the center. In addition, the present invention may also be similarly applied to a radial method of performing sampling in the unspecified direction of measurement-space, for example, a radial method in three-dimensional space, a radial method of performing sampling from the center of measurement-space toward the outside and then performing sampling so as to return to the center again, and the like. In addition, the present invention may also be similarly applied to a hybrid radial method in which the radial method and the phase encoding gradient magnetic field pulse are combined.

In addition, although the example of the exponential function has been shown as an approximation function of the gradient magnetic field pulse waveform, the example of the function is not limited to this. Various forms of functions may be applied according to the configuration of the system.

In addition, the system response of the gradient magnetic field output may be similarly considered for all pulse sequences executable in the MRI apparatus as well as the case of the radial method. A significant improvement in image quality can be obtained by applying the present invention to the sequence in which the error of the gradient magnetic field output has a large effect on the image quality, such as an echo planar method or a fast spin echo method that acquires a plurality of echo signals by one RE irradiation. That is, high-accuracy approximation is possible by approximating the gradient magnetic field pulse waveform shape with at least two approximation functions, and correction calculation can be easily performed in response to changes in imaging conditions by using the parameters of the approximation functions stored in the storage device.

INDUSTRIAL APPLICABILITY

According to the present invention, it is possible to obtain a high-accuracy MR image that has good image quality and has no influence of the system response of the gradient magnetic field.

REFERENCE SIGNS LIST

2: static magnetic field generation system
3: gradient magnetic field generation system
4: sequencer
5: signal transmission system
6: signal receiving system
7: signal processing system
8: CPU
100, 200: storage device

The invention claimed is:

1. A magnetic resonance imaging apparatus comprising:
a static magnetic field generation unit;
a gradient magnetic field generation unit that gives a magnetic field gradient to a static magnetic field generated by the static magnetic field generation unit;
a signal transmission unit that irradiates an examination target placed in the static magnetic field with a high-frequency magnetic field;
a signal receiving unit that receives an echo signal emitted from the examination target due to nuclear magnetic resonance; and
a signal processing unit that processes the echo signal to reconstruct an image of the examination target, wherein
the signal processing unit includes an approximation function generation unit that generates an approximation function that, for each of at least two temporally divided sections of a gradient magnetic field pulse waveform to which the magnetic field gradient is given by the gradient magnetic field generation unit, approximates the gradient magnetic field pulse waveform and a correction unit that corrects measurement-space coordinates, at which the echo signal is arranged, using the approximation function.

2. The magnetic resonance imaging apparatus according to claim 1, wherein at least the two approximation functions include different kinds of approximation functions.

3. The magnetic resonance imaging apparatus according to claim 2, wherein, among the approximation functions including the different kinds of approximation functions, at least one approximation function is an exponential function and at least one approximation function is a linear function.

4. The magnetic resonance imaging apparatus according to claim 1, wherein the approximation function generation unit includes a parameter calculation unit that approximates the approximation function by calculating a parameter, which expresses the approximation function, using the echo signal.

5. The magnetic resonance imaging apparatus according to claim 4, wherein the measured echo signal is obtained by executing a preliminary measurement pulse sequence for measuring a gradient magnetic field pulse waveform shape for gradient magnetic fields of a plurality of axes, and the approximation function generation unit calculates a parameter of an approximation function for each of gradient magnetic field pulse waveforms of the plurality of axes.

6. The magnetic resonance imaging apparatus according to claim 4, wherein parameters of at least the two approximation functions are changed according to imaging conditions.

7. The magnetic resonance imaging apparatus according to claim 4, wherein the parameter calculation unit includes an evaluation value calculation unit that calculates an evaluation value, which is for evaluating a degree of improvement of image quality of the image, from the image and a determination unit that determines an optimum value of a parameter on the basis of the evaluation value calculated by the evaluation value calculation unit.

8. The magnetic resonance imaging apparatus according to claim 7, wherein the parameter calculation unit sets a region of interest in the image, calculates the evaluation value on the basis of a signal value of the region of interest, and determines the optimum value of the parameter from relationship between the evaluation value and a value of a parameter used when generating the image.

9. The magnetic resonance imaging apparatus according to claim 1, wherein at least the two approximation functions have the same inclination between adjacent sections.

10. A method for correcting measurement-space coordinates of an echo signal measured by a magnetic resonance imaging apparatus, the measurement-space coordinate correction method comprising:
a step of approximating a gradient magnetic field pulse waveform shape with at least two approximation functions;
a step of storing a parameter of each approximation function in a storage unit; and
a step of correcting the measurement-space coordinates of the echo signal using the parameter stored in the storage unit and the measured echo signal.

11. The measurement-space coordinate correction method according to claim 10, wherein, in the approximation step, an approximation function is set for each of a plurality of different gradient magnetic field pulse waveform shapes corresponding to a plurality of imaging conditions.

12. The measurement-space coordinate correction method according to claim 10, wherein the approximation step includes a step of optimizing a parameter of an approximation function.

13. The measurement-space coordinate correction method according to claim 12, wherein, in the optimization step, an optimum value of a parameter is calculated by repeating an image reconstruction step of reconstructing an image using measurement-space coordinates, which are corrected using an initial value of a parameter, and the measured echo signal while changing the initial value of the parameter.

14. The measurement-space coordinate correction method according to claim 13, wherein the optimization step includes an evaluation value calculation step of calculating an evaluation value, which is for evaluating a degree of improvement of image quality of the image, from the image and a determination step of determining an optimum value of a parameter on the basis of the calculated evaluation value after the image reconstruction step.

* * * * *